(12) United States Patent
Cheng et al.

(10) Patent No.: US 10,513,429 B2
(45) Date of Patent: Dec. 24, 2019

(54) INTEGRATION SCHEME FOR MICROELECTROMECHANICAL SYSTEMS (MEMS) DEVICES AND COMPLEMENTARY METAL-OXIDE-SEMICONDUCTOR (CMOS) DEVICES

(71) Applicant: Taiwan Semiconductor Manufacturing Co., Ltd., Hsin-Chu (TW)

(72) Inventors: Chun-Wen Cheng, Zhubei (TW); Chia-Hua Chu, Zhubei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 94 days.

(21) Appl. No.: 15/285,032

(22) Filed: Oct. 4, 2016

(65) Prior Publication Data

US 2018/0029882 A1 Feb. 1, 2018

Related U.S. Application Data

(60) Provisional application No. 62/367,326, filed on Jul. 27, 2016.

(51) Int. Cl.
*B81C 1/00* (2006.01)
(52) U.S. Cl.
CPC ...... *B81C 1/00238* (2013.01); *B81C 1/00246* (2013.01); *B81C 2203/0735* (2013.01); *B81C 2203/0771* (2013.01); *B81C 2203/0785* (2013.01)
(58) Field of Classification Search
CPC . H01L 41/00–41/0536; H01L 41/08–41/1138; B81B 2201/02; B81B 2201/0264; B81B 2201/0285; B81B 2203/01; B81B 2203/05; B81B 3/00; B81C 1/00134; B81C 1/00023; B81C 1/00261; B81C 1/00341
USPC .............................. 257/415; 438/50, 51, 53
See application file for complete search history.

(56) References Cited

U.S. PATENT DOCUMENTS

| | | | |
|---|---|---|---|
| 8,367,451 B2* | 2/2013 | Qiu | B81C 1/00095 257/E21.495 |
| 9,040,334 B2* | 5/2015 | Chu | B81C 1/00134 438/50 |
| 9,546,090 B1* | 1/2017 | Xia | B81B 7/007 |
| 9,796,582 B1* | 10/2017 | Cheng | B81C 1/00246 |
| 2007/0202628 A1* | 8/2007 | Wuertz | B81C 1/00246 438/53 |
| 2007/0281381 A1* | 12/2007 | Ayazi | B81C 1/00285 438/52 |

(Continued)

*Primary Examiner* — Bac H Au
(74) *Attorney, Agent, or Firm* — Eschweiler & Potashnik, LLC

(57) ABSTRACT

Processes for integrating complementary metal-oxide-semiconductor (CMOS) devices with microelectromechanical systems (MEMS) devices are provided. In some embodiments, the MEMS devices are formed on a sacrificial substrate or wafer, the sacrificial substrate or wafer is bonded to a CMOS die or wafer, and the sacrificial substrate or wafer is removed. In other embodiments, the MEMS devices are formed over a sacrificial region of a CMOS die or wafer and the sacrificial region is subsequently removed. Integrated circuit (ICs) resulting from the processes are also provided.

20 Claims, 31 Drawing Sheets

(56) References Cited

U.S. PATENT DOCUMENTS

| | | | |
|---|---|---|---|
| 2009/0134513 A1* | 5/2009 | Qiu | B81C 1/00095 257/734 |
| 2013/0168740 A1* | 7/2013 | Chen | B81C 1/00238 257/254 |
| 2014/0264661 A1* | 9/2014 | Cheng | B81C 3/001 257/417 |
| 2015/0210540 A1* | 7/2015 | Sadaka | B81C 1/00238 257/414 |
| 2015/0298965 A1* | 10/2015 | Tsai | B81C 1/00182 257/415 |
| 2015/0349745 A1* | 12/2015 | Small | H03H 3/02 310/313 R |
| 2016/0167945 A1* | 6/2016 | Chang | B81B 3/001 257/415 |

* cited by examiner

INTEGRATION SCHEME FOR MICROELECTROMECHANICAL SYSTEMS (MEMS) DEVICES AND COMPLEMENTARY METAL-OXIDE-SEMICONDUCTOR (CMOS) DEVICES

REFERENCE TO RELATED APPLICATION

This application claims the benefit of U.S. Provisional Application No. 62/367,326, filed on Jul. 27, 2016, the contents of which are incorporated by reference in their entirety.

BACKGROUND

Microelectromechanical systems (MEMS) devices are microscopic devices that integrate mechanical and electrical components to sense physical quantities and/or to act upon surrounding environments. In recent years, MEMS devices have become increasingly common. For example, MEMS accelerometers are commonly found in airbag deployment systems, tablet computers, and smart phones.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
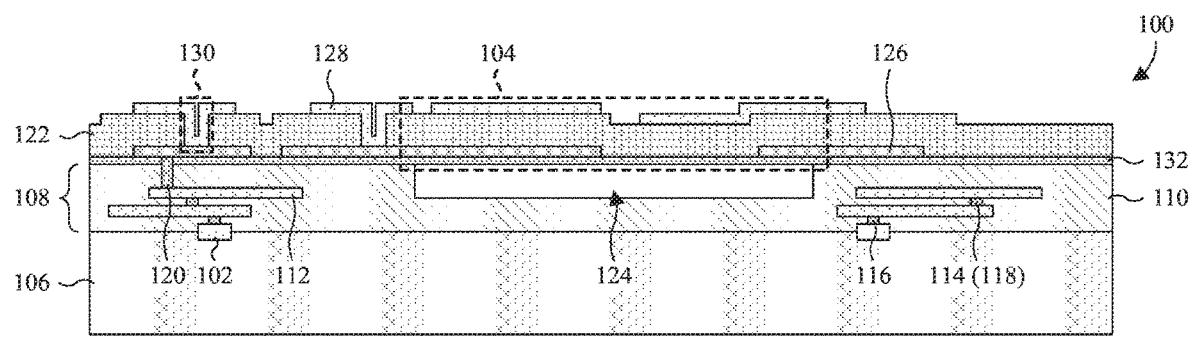
FIG. 1 illustrates a cross-sectional view of some embodiments of an IC that comprises complementary metal-oxide-semiconductor (CMOS) devices integrated with a microelectromechanical systems (MEMS) device.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Microelectromechanical systems (MEMS) devices are often packaged with and electrically coupled to complementary metal-oxide-semiconductor (CMOS) devices. One method for doing so is to bond a MEMS die and a CMOS die together and to electrically couple the MEMS die to the CMOS die using wire bonding. However, wire bonding results in a large amount of parasitic capacitance that leads to low performance. Further, the method is performed at the die level, such that the method has high packaging time and high packaging complexity, thereby leading to high costs.

Another method for packaging and electrically coupling MEMS devices and CMOS devices together is to form the MEMS devices directly on CMOS dies using sacrificial layers. For example, a sacrificial layer may be formed over a CMOS die, such that a back-end-of-line (BEOL) interconnect structure of the CMOS die is between the sacrificial layer and a semiconductor substrate of the CMOS die. Further, a piezoelectric layer may be formed over the sacrificial layer, and a release hole may be formed extending through the piezoelectric layer to the sacrificial layer. With the release hole formed, an etchant may be applied to the sacrificial layer, through the release hole, to at least partially remove the sacrificial layer and to form a cavity between the CMOS die and the piezoelectric layer.

A challenge with the foregoing method is that high temperatures may damage devices on the CMOS die and/or damage the sacrificial layer. For example, high temperatures used for sputtering or otherwise forming the piezoelectric layer may damage photoresist or an organic compound used for the sacrificial layer. Yet another challenge with the foregoing method arises when a dielectric layer of the BEOL interconnect structure is used for the sacrificial layer. In this situation, wiring layers of the BEOL interconnect structure may peel or otherwise become damaged as the dielectric layer is removed.

In view of the foregoing, the present application is directed towards a method for integrating CMOS devices with MEMS devices together, as well as integrated circuits (ICs) resulting from the method. In some first embodiments of the method, a BEOL interconnect structure is formed covering a semiconductor substrate and CMOS devices, where the BEOL interconnect structure comprises a dielectric stack. A first etch is performed into the dielectric stack to form a trench laterally enclosing a sacrificial dielectric region. A lateral etch stop layer is formed lining the trench and having a top surface even with a top surface of the dielectric stack. A piezoelectric layer is formed covering the BEOL interconnect structure and the lateral etch stop layer. Further, the piezoelectric layer is formed with a MEMS device electrically coupled to the CMOS devices through the BEOL interconnect structure. A second etch is performed into the sacrificial dielectric region to remove the sacrificial dielectric region and to form a cavity in place of the sacrificial dielectric region.

Advantageously, the first embodiments of the method may be performed at the wafer level for low packaging time and low packaging complexity. This, in turn, may lead to low costs. Further, the first embodiments of the method advantageously do not rely upon wire bonding, such that parasitic capacitance between the MEMS and CMOS devices may be low. Even more, the first embodiments of the method are monolithic in that the first embodiments may be performed with a single wafer, such that costs may be low.

In some second embodiments of the method, a top wiring layer is formed over interlayer dielectric (ILD) layers stacked over a semiconductor substrate, and is further formed electrically coupled to CMOS devices arranged in the semiconductor substrate through wiring layers in the ILD layers. A piezoelectric layer is formed over a sacrificial substrate, and is further formed with a MEMS device. A first electrode layer is formed over the sacrificial substrate, before or after forming the piezoelectric layer. After forming the first electrode layer, the sacrificial substrate is bonded to the semiconductor substrate, such that the sacrificial substrate overlies the top wiring layer and the piezoelectric layer. The sacrificial substrate is removed. A second electrode layer is formed on the piezoelectric layer and comprises a via extending through the piezoelectric layer to the first electrode layer, wherein the second electrode is formed before or after the bonding. The MEMS device is electrically coupled to the CMOS devices by the bonding or by through vias formed after the bonding.

Advantageously, the second embodiments of the method may be performed at the wafer level for low packaging time and low packaging complexity. This, in turn, may lead to low costs. Further, the second embodiments of the method advantageously do not rely upon wire bonding, such that parasitic capacitance between the MEMS and CMOS devices may be low. Even more, the second embodiments of the method may have a low number of steps after bonding and do not depend upon a sacrificial layer.

With reference to FIG. 1, a cross-sectional view 100 of some embodiments of an IC comprising CMOS devices 102 integrated with a MEMS device 104 is provided. As illustrated, the CMOS devices 102 are arranged over a semiconductor substrate 106, recessed below an upper or top surface of the semiconductor substrate 106. The CMOS devices 102 may be, for example, insulated-gate field-effect transistors (IGFETs), metal-oxide-semiconductor field-effect transistors (MOSFETs), some other transistors, or a combination of the foregoing. The semiconductor substrate 106 may be, for example, a bulk substrate of monocrystalline silicon or a bulk substrate of some other semiconductor.

A BEOL interconnect structure 108 at least partially covers the CMOS devices 102 and the semiconductor substrate 106, and is configured to electrically couple the CMOS devices 102 to one another and/or to the MEMS device 104. The BEOL interconnect structure 108 comprises a dielectric region 110, as well as a plurality of wiring layers 112 and a plurality of via layers 114 alternatingly stacked within the dielectric region 110. The dielectric region 110 may be, for example, silicon dioxide, a low κ dielectric, some other dielectric, or a combination of the foregoing. As used here, a low κ dielectric is a dielectric constant κ less than about 3.9.

The wiring layers 112 and the via layers 114 are conductive and may be, for example, aluminum copper, copper, aluminum, tungsten, some other conductive material, or a combination of the foregoing. Further, the wiring layers 112 and the via layers 114 collectively define conductive paths between the CMOS devices 102 and the MEMS device 104. Even more, the wiring layers 112 are made of individual wires (not labeled), and the via layers 114 are made of individual vias. The via layers 114 comprise a contact via layer 116 and one or more inter-wire via layers 118. The contact via layer 116 is between the CMOS devices 102 and a bottom wiring layer to provide electrical coupling therebetween. The inter-wire via layer(s) 118 is/are between neighboring wiring layers to provide electrical coupling between the neighboring wiring layers. In some embodiments, the via layers 114 also comprises an inter-device via layer 120. The inter-device via layer 120 is between a top wiring layer and the MEMS device 104 to provide electrical coupling therebetween.

A piezoelectric layer 122 is arranged over the BEOL interconnect structure 108 and the semiconductor substrate 106, and is spaced over the semiconductor substrate 106 by a cavity 124. Further, the piezoelectric layer 122 comprises the MEMS device 104 and may be, for example, aluminum nitride, zinc oxide, lead zirconate titanate, some other piezoelectric material, or a combination of the foregoing. The MEMS device 104 is electrically coupled to the CMOS devices 102 through the BEOL interconnect structure 108, and may be, for example, a microphone, an accelerometer, a motion sensor, a pressure sensor, or a gyroscope.

In operation, the MEMS device 104 may, for example, move or vibrate within the cavity 124 in response to an external stimulus. This movement or vibration generates a voltage that varies predictably in dependence on the extent of the movement or vibration, such that the voltage can be used by the CMOS devices 102 to measure the external stimulus. The external stimulus may be, for example, acceleration and/or movement of the IC, sound waves impinging on the MEMS device 104, or a pressure differential between the cavity 124 and an ambient environment of IC. Alternatively, in operation, the MEMS device 104 may, for example, move or vibrate within the cavity 124 in response to a voltage from the CMOS devices 102.

A first electrode layer 126 and a second electrode layer 128 are arranged on the piezoelectric layer 122, with one of the first and second electrode layers 126, 128 being over the piezoelectric layer 122 and another one of the first and second electrode layers 126, 128 being under the piezoelectric layer 122. Further, the first and second electrode layers 126, 128 electrically couple to the CMOS devices 102 through the BEOL interconnect structure 108, and to the MEMS device 104. The first and second electrode layers 126, 128 comprise corresponding first and second electrodes, and the second electrode layer 128 further comprises one or more through vias 130. At least one of the through via(s) 130 extends through the piezoelectric layer 122 to the first electrode layer 126 and electrically couples the first electrode layer 126 to the second electrode layer 128. The first and second electrode layers 126, 128 may be aluminum copper, aluminum, molybdenum, gold, platinum, some other conductive material, or a combination of the foregoing.

In some embodiments, a seed layer 132 adjoins the first electrode layer 126 and the piezoelectric layer 122, such that the first electrode layer 126 is arranged between the piezoelectric layer 122 and the seed layer 132. The seed layer 132 may be, for example, the same material as the piezoelectric layer 122, and/or may be, for example, silicon nitride, aluminum nitride, zinc oxide, lead zirconate titanate, some other material resistant to vapor hydrofluoric acid (VHF) or a buffered oxide etchant (BOE), or a combination of the foregoing.

With reference to FIGS. 2A-2J, cross-sectional views 200A-200J of some more detailed embodiments of the IC of FIG. 1 are provided.

Figure 2A:
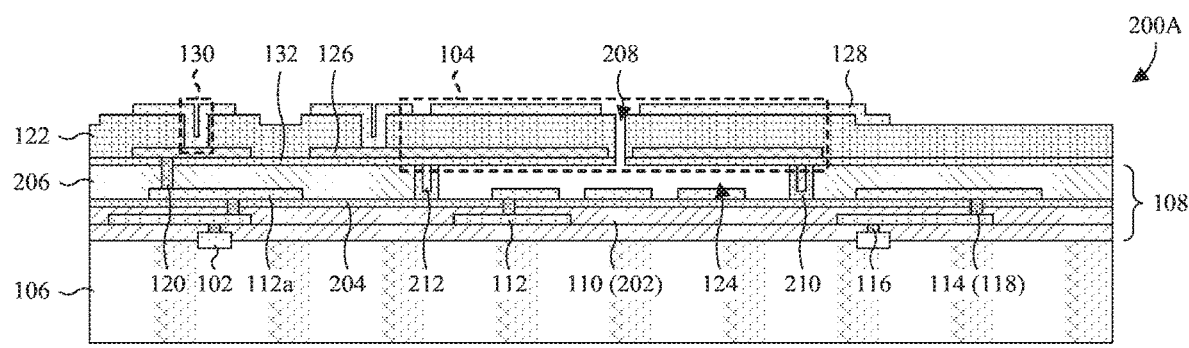
FIGS. 2A-2J illustrate cross-sectional views of some more detailed embodiments of the IC of FIG. 1.

As illustrated by the cross-sectional view 200A of FIG. 2A, CMOS devices 102 are arranged over a semiconductor substrate 106 and covered by a BEOL interconnect structure 108. The BEOL interconnect structure 108 comprises a dielectric region 110, as well as wiring layers 112 and via layers 114. The dielectric region 110 comprises interlayer dielectric (ILD) layers 202 stacked upon one another, as well as a vertical etch stop layer 204 and a passivation layer 206 covering the ILD layers 202. The vertical etch stop layer 204 defines a bottom surface of a cavity 124 arranged thereover and may be, example, aluminum nitride, aluminum oxide, silicon carbide, or some other material resistant to VHF or a BOE. The passivation layer 206 is arranged over the vertical etch stop layer 204, and extends laterally to enclose the cavity 124 over the ILD layers 202 and the vertical etch stop layer 204. The passivation layer 206 and the ILD layers 202 may be, for example, silicon dioxide, a low κ dielectric, some other dielectric, or a combination of the foregoing.

The wiring layers 112 and the via layers 114 are alternatingly stacked within the dielectric region 110. The via layers 114 comprise a contact via layer 116 and one or more inter-wire via layers 118 electrically coupling the wiring layers 112 to the CMOS devices. Further, the via layers 114 comprise an inter-device via layer 120 electrically coupling a top wiring layer 112a to a first electrode layer 126 overlying the top wiring layer 112a. The top wiring layer 112a is partially covered by the passivation layer 206, and comprises wires arranged in the cavity 124. The inter-device via layer 120 extends from the top wiring layer 112a, through the passivation layer 206 and a seed layer 132, to the first electrode layer 126. The seed layer 132 is arranged over the passivation layer 206, between the passivation layer 206 and the first electrode layer 126, and defines a top surface of the cavity 124.

A piezoelectric layer 122 and a second electrode layer 128 cover the first electrode layer 126 and the seed layer 132, and the piezoelectric layer 122 further fills gaps between individual electrodes of the first electrode layer 126. The piezoelectric layer 122 comprises a MEMS device 104 and a release hole 208. The MEMS device 104 covers the cavity 124 and is configured to move or vibrate within the cavity 124. Further, the MEMS device 104 is electrically coupled to the CMOS devices 102 through the first and second electrode layers 126, 128 and the BEOL interconnect structure 108. The release hole 208 extends through the piezoelectric layer 122 and opens the cavity 124 to an ambient environment of the IC. The second electrode layer 128 is arranged over the piezoelectric layer 122, and comprises one or more through vias 130 extending through the piezoelectric layer 122 to the first electrode layer 126, thereby electrically coupling the first and second electrode layers 126, 128.

A lateral etch stop layer 210 is arranged in the cavity 124 and defines sidewalls of cavity 124. The lateral etch stop layer 210 extends vertically from the vertical etch stop layer 204 to the seed layer 132, and extends laterally to enclose the cavity 124. In some embodiments, the lateral etch stop layer 210 is ring-shaped and/or has a U-shaped profile as it extends laterally along a boundary of the cavity 124. Further, in some embodiments, an interior of the U-shaped profile is filled with a filler layer 212. The lateral etch stop layer 210 may be, example, aluminum nitride, aluminum oxide, silicon carbide, or some other material resistant to VHF or BOE. The filler layer 212 may be, for example, silicon dioxide, a low κ dielectric, some other dielectric, or a combination of the foregoing.

Figure 2B:
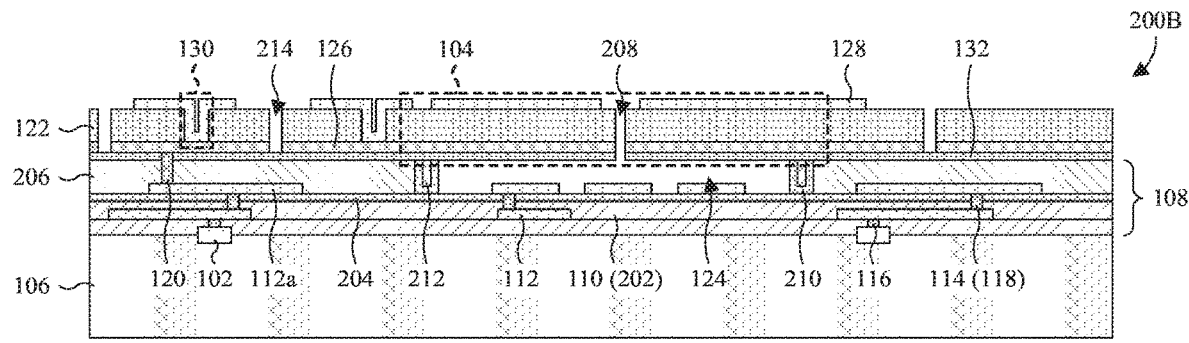

As illustrated by the cross-sectional view 200B of FIG. 2B, a variant of FIG. 2A is provided in which a bottom surface of the piezoelectric layer 122 is arranged over the first electrode layer 126. Further, isolation trenches 214 extend to the seed layer 132, through the piezoelectric layer 122 and the first electrode layer 126. The isolation trenches 214 define individual electrodes in the first electrode layer 126, as well as provide electrical isolation between the individual electrodes.

Figure 2C:
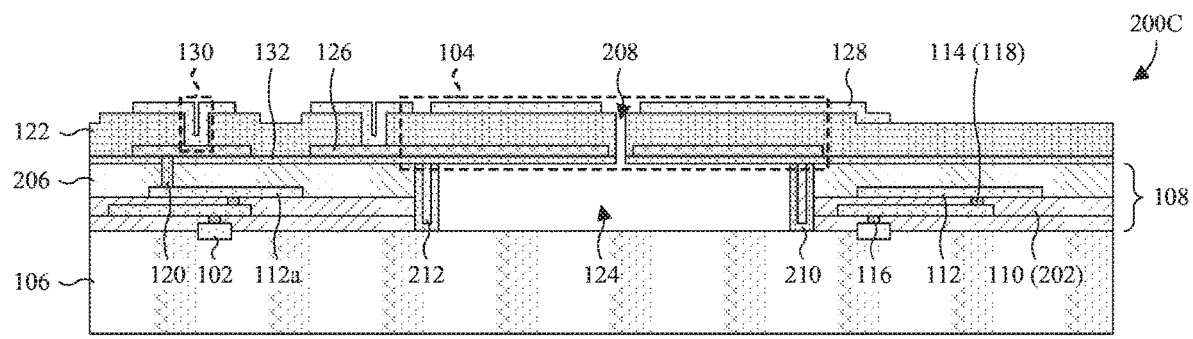
Figure 2D:
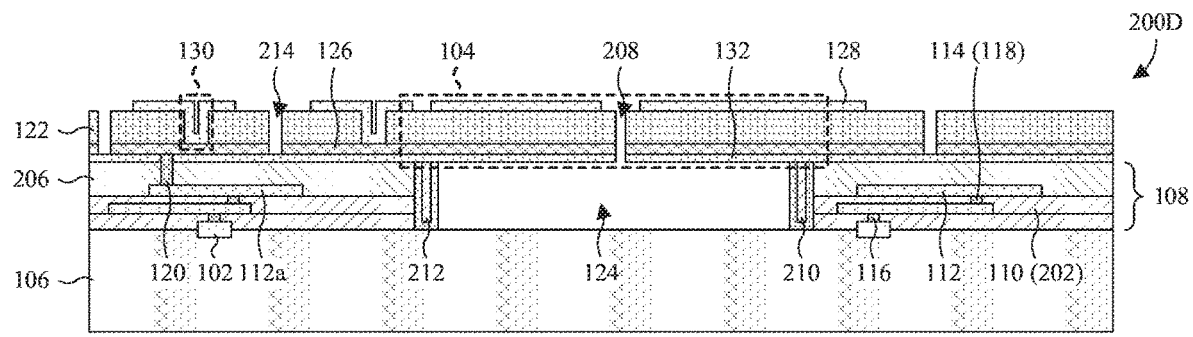

As illustrated by the cross-sectional views 200C, 200D of FIGS. 2C and 2D, variants respectively of FIGS. 2A and 2B are provided in which the cavity 124 extends from the seed layer 132 to the semiconductor substrate 106. In such embodiments, the lateral etch stop layer 210 and the filler layer 212 extend from the semiconductor substrate 106 to the seed layer 132. Further, the vertical etch stop layer 204 of FIGS. 2A and 2B is omitted, and a region of the BEOL interconnect structure 108 that was directly under the cavity 124 in FIGS. 2A and 2B is omitted.

Figure 2E:
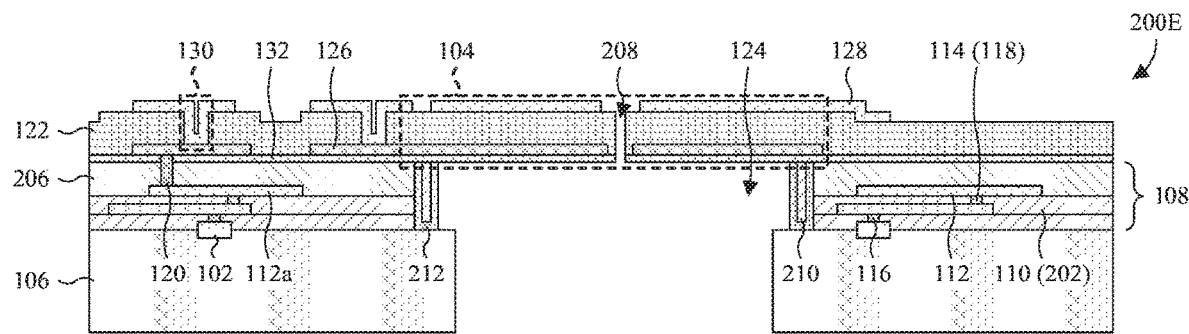

As illustrated by the cross-sectional view 200E of FIG. 2E, a variant of FIG. 2C is provided in which the cavity 124 extends through the semiconductor substrate 106. In such embodiments, the MEMS device 104 may be, for example, a microphone.

Figure 2F:
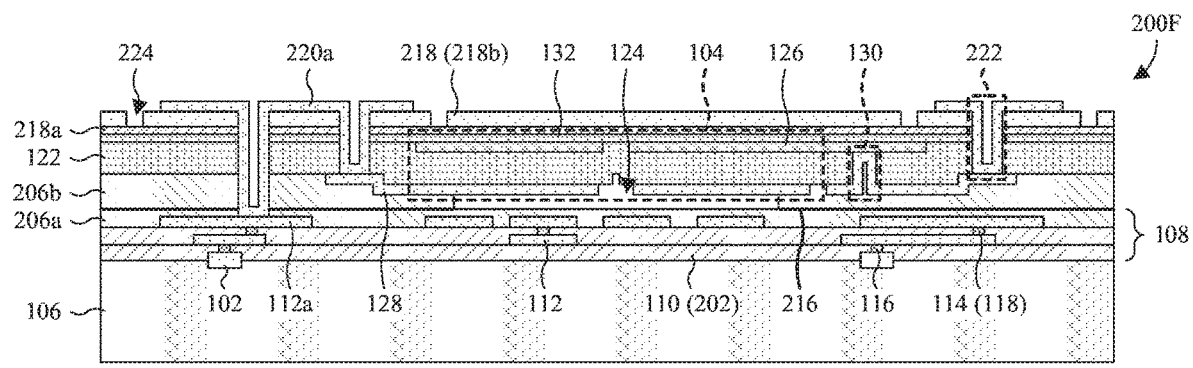

As illustrated by the cross-sectional view 200F of FIG. 2F, CMOS devices 102 are arranged over a semiconductor substrate 106 and covered by a BEOL interconnect structure 108. The BEOL interconnect structure 108 comprises a dielectric region 110, as well as wiring layers 112 and via layers 114. The dielectric region 110 comprises ILD layers 202 stacked upon one another, as well as a first passivation layer 206a and a second passivation layer 206b covering the ILD layers 202. The first passivation layer 206a covers the wiring and via layers 112, 114 and defines a bottom surface of a cavity 124 that overlies the first passivation layer 206a. The second passivation layer 206b is arranged over the first passivation layer 206a and contacts the first passivation layer 206a at a bond interface 216. Further, the second passivation layer 206b laterally surrounds the cavity 124 to define sidewalls of the cavity 124. The first and second passivation layers 206a, 206b may be, for example, silicon dioxide, some other oxide, some other dielectric, or a combination of the foregoing.

A piezoelectric layer 122 and a second electrode layer 128 cover the second passivation layer 206b and the cavity 124, and further define a top surface of the cavity 124. The piezoelectric layer 122 is arranged over the second electrode layer 128, and comprises a MEMS device 104. The MEMS device 104 covers the cavity 124 and is configured to move or vibrate within the cavity 124. Further, the MEMS device 104 is electrically coupled to the CMOS devices 102 through the second electrode layer 128 and the BEOL interconnect structure 108. The second electrode layer 128 is recessed below an upper or top surface of the second passivation layer 206b and, in some embodiments, has an upper or top surface that is even with the upper or top surface of the second passivation layer. Further, the second electrode layer 128 comprises one or more first through vias 130 extending through the piezoelectric layer 122 to a first electrode layer 126 that overlies the piezoelectric layer 122.

The first electrode layer 126 is arranged over the piezoelectric layer 122, and is covered by a seed layer 132 and one or more capping layers 218. Further, the first electrode layer 126 is recessed below an upper or top surface of the piezoelectric layer 122 and, in some embodiments, has an upper or top surface that is even with the upper or top surface of the piezoelectric layer 122. The capping layer(s) 218 overly the seed layer 132 and, in some embodiments, comprise a first capping layer 218a and a second capping layer 218b stacked such that the second capping layer 218b overlies the first capping layer 218a. The first and second capping layers 218a, 218b are different materials and, in some embodiments, the first and second capping layers 218a, 218b are respectively a polycrystalline material and a dielectric material. For example, the first capping layer 218a may be silicon dioxide or some other oxide, and the second capping layer 218b may be polysilicon.

A third electrode layer 220a is arranged over the capping layer(s) 218, and electrically couples the CMOS devices 102 to the MEMS device 104. The third electrode layer 220a comprises individual electrodes and a plurality of second through vias 222. The individual electrodes overlie the capping layers 218 and, in some embodiments, are electrically isolated by isolation trenches 224 extending through the second capping layer 218b. The second through vias 222 respectively extend to a top wiring layer 112a of the BEOL interconnect structure 108 and the second electrode layer 128, and respectively electrically couple the third electrode layer 220a to the CMOS devices 102 and to the MEMS device 104. The third electrode layer 220a may be, for example, aluminum copper, aluminum, molybdenum, gold, platinum, some other conductive material, or a combination of the foregoing.

Figure 2G:
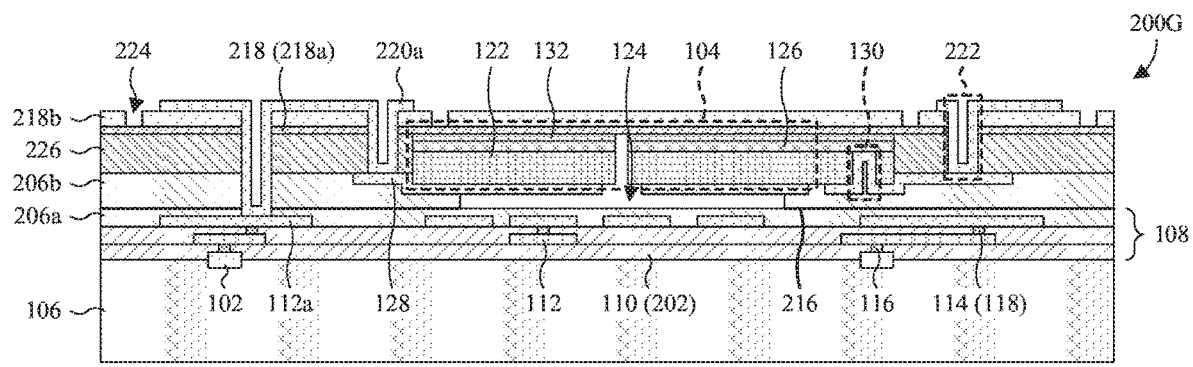

As illustrated by the cross-sectional view 200G of FIG. 2G, a variant of FIG. 2F is provided in which the piezoelectric layer 122, the first electrode layer 126, and the seed layer 132 are laterally enclosed by an enclosing dielectric layer 226. The enclosing dielectric layer 226 is vertically arranged between the second passivation layer 206b and the capping layer(s) 218 and may be, for example, silicon dioxide, silicon nitride, some other oxide or nitride, some other dielectric, or a combination of the foregoing.

Figure 2H:
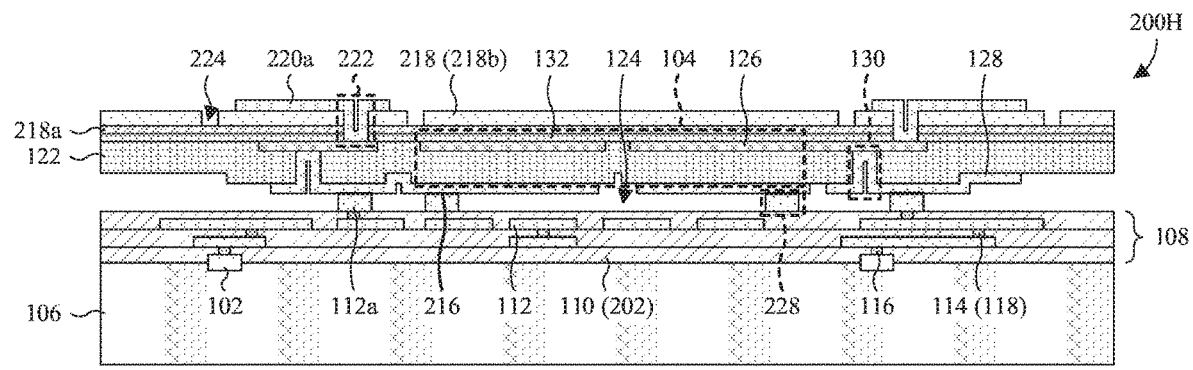

As illustrated by the cross-sectional view 200H of FIG. 2H, a variant of FIG. 2F is provided in which the first and second passivation layers 206a, 206b of FIG. 2F are omitted. Further, the top wiring layer 112a comprises a wire 228 extending laterally to enclose and define sidewalls of a cavity 124, and may be, for example, thicker than underlying wiring layers and/or ring-shaped. Even more, the top wiring layer 112a is covalently or eutectically bonded with the second electrode layer 128 at the bond interface 216. For example, the top wiring layer 112a and the second electrode layer 128 may be aluminum copper, may be aluminum, may be gold, or may be doped silicon, and may be covalently bonded at the bond interface 216. As another example, the top wiring layer 112a and the second electrode layer 128 may respectively be aluminum and germanium, may respectively be gold and germanium, or may respectively be gold and doped silicon, and may be eutectically bonded at the bond interface 216. Moreover, the second through vias 222 extend to the first electrode layer 126, and electrically couple the third electrode layer 220a to the MEMS device 104.

Figure 2I:
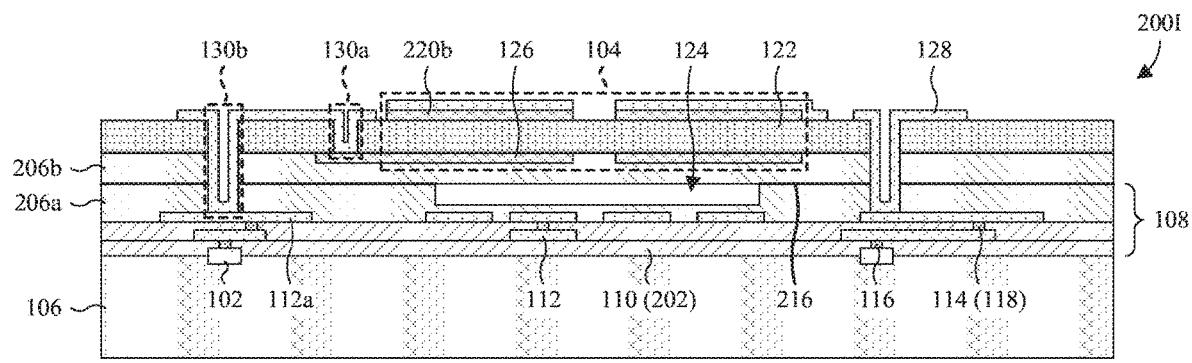
Figure 2J:
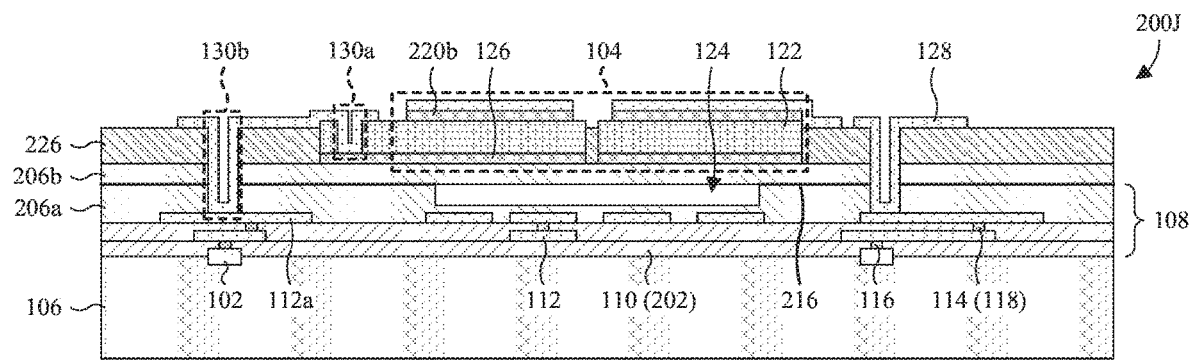

As illustrated by the cross-sectional views 200I, 200J of FIGS. 2I and 2J, variants respectively of FIGS. 2F and 2G are provided in which the first passivation layer 206a defines a bottom surface of the cavity 124, and laterally encloses the cavity 124 to define sidewalls of the cavity 124. Further, the second passivation layer 206b defines a top surface of the cavity 124, the seed layer 132 of FIGS. 2F and 2G and the capping layer(s) 218 of FIGS. 2F and 2G are omitted, and the first electrode layer 126 is covered by the piezoelectric layer 122. Even more, the second electrode layer 128 is arranged over the piezoelectric layer 122 and at least partially covers a third electrode layer 220b that is arranged over the piezoelectric layer 122. The second electrode layer 128 comprises through vias 130a, 130b respectively extending through the piezoelectric layer 122 and the enclosing dielectric layer 226 respectively to the first electrode layer 126 and the top wiring layer 112a. The third electrode layer 220b may be, for example, aluminum copper, aluminum, molybdenum, gold, platinum, some other conductive material, or a combination of the foregoing.

With reference to FIGS. 3-7, 8A-8E, and 9A-9F, a series of cross-sectional views 300-700, 800A-800E, 900A-900F of some embodiments of methods for manufacturing the ICs of FIGS. 2A-2D is provided.

Figure 3:
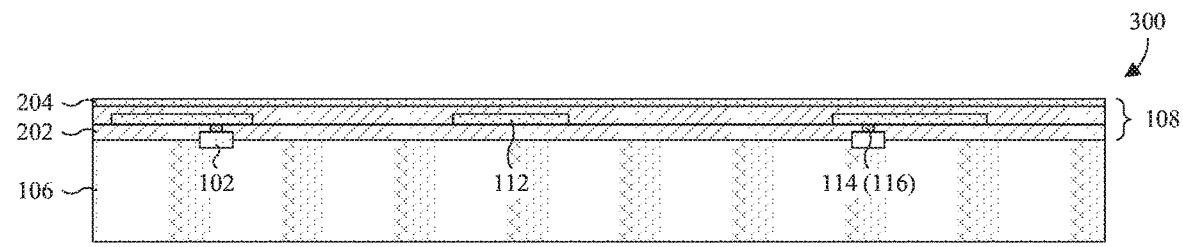
FIGS. 3-7, 8A-8E, 9A-9F, and 10-18 illustrate a series of cross-sectional views of some embodiments of methods for manufacturing the ICs of FIGS. 2A-2E.

As illustrated by the cross-sectional view 300 of FIG. 3, a vertical etch stop layer 204 is formed over ILD layers 202 of a BEOL interconnect structure 108. The ILD layers 202 cover CMOS devices 102 arranged atop a semiconductor substrate 106, and further accommodate one or more wiring layers 112 and one or more via layers 114. The one or more wiring layers 112 and the one or more via layers 114 are alternatingly stacked within the ILD layers 202, and are electrically coupled to the CMOS devices 102. The vertical etch stop layer 204 may be, for example, formed by sputtering or vapor deposition, and/or may be, for example, formed of aluminum nitride, aluminum oxide, silicon carbide, or a dielectric material that is resistant to VHF or BOE.

While only a single wiring layer and a single via layer are shown in FIG. 3, it is to be appreciated that a plurality of wiring layers may be alternatingly stacked with a plurality of via layers. For example, the wiring layer(s) 112 may comprise a bottom wiring layer and one or more intermediate wiring layers (not shown) thereover, and the via layer(s) 114 may comprise a contact via layer 116 and one or more inter-wire via layers (not shown). The contact via layer 116 extends from the bottom wiring layer to the CMOS devices 102 to provide electrical coupling therebetween, and the one or more inter-wire via layers extend between neighboring wiring layers to provide electrical coupling therebetween.

Figure 4:
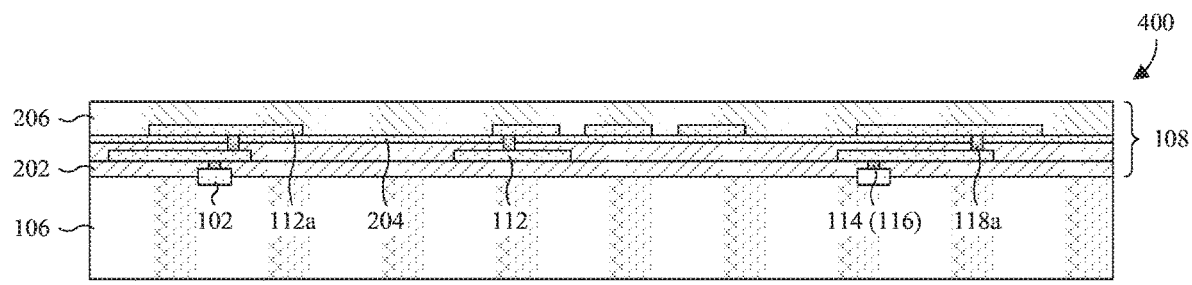

As illustrated by the cross-sectional view 400 of FIG. 4, a top wiring layer 112a and a top inter-wire via layer 118a are formed. The top wiring layer 112a is formed over the vertical etch stop layer 204 and the top inter-wire via layer 118a. Further, the top wiring layer 112a is formed electrically coupled to an underlying wiring layer by the top inter-wire via layer 118a. The top inter-wire via layer 118a is formed extending through the vertical etch stop layer 204 to the underlying wiring layer. The top wiring layer 112a may, for example, be formed of aluminum copper, molybdenum, aluminum, or gold, and the top inter-wire via 118a may, for example, be formed of tungsten. Further, the top wiring layer 112a and the top inter-wire via layer 118a may be, for example, formed by a dual-damascene-like process or a single damascene-like process. As used herein, dual-damascene-like and single-damascene-like processes are respectively dual-damascene and single-damascene processes that are not restricted to copper.

Also illustrated by the cross-sectional view 400 of FIG. 4, a passivation layer 206 is formed covering the top wiring layer 112a and the vertical etch stop layer 204. Further, the passivation layer 206 is formed with an upper or top surface that is planar. The passivation layer 206 may, for example, be formed of silicon dioxide, a low κ dielectric, some other dielectric, or a combination of the foregoing.

In some embodiments, the process for forming the passivation layer 206 comprises depositing or growing the passivation layer 206, and subsequently performing a planarization into the upper or top surface of the passivation layer 206. The passivation layer 206 may be deposited or grown by, for example, thermal oxidation, vapor deposition, sputtering, or some other deposition or growth process. Further, the planarization may, for example, be performed by a chemical mechanical polish (CMP).

Figure 5:
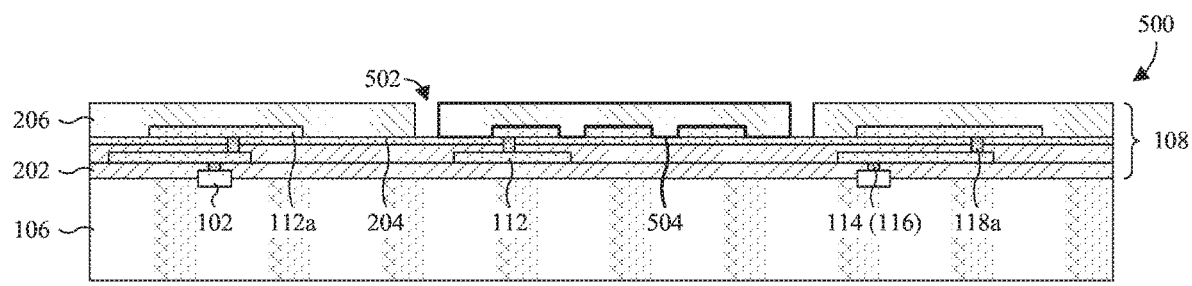

As illustrated by the cross-sectional view 500 of FIG. 5, a first etch is performed into the passivation layer 206 to form a trench 502 laterally enclosing a sacrificial dielectric region 504 in the passivation layer 206. The trench 502 may, for example, have a ring shape. In some embodiments, the process for performing the first etch comprises forming and patterning a photoresist layer over the passivation layer 206, applying an etchant to the passivation layer 206 with the photoresist layer in place, and removing the photoresist layer.

Figure 6:
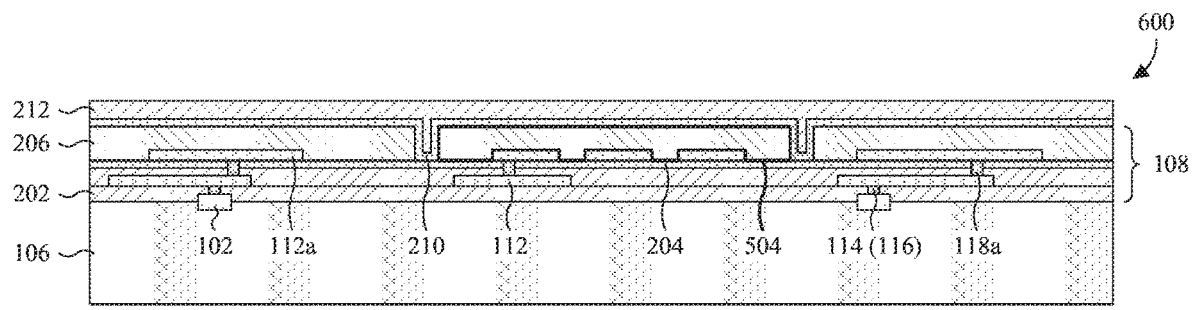

As illustrated by the cross-sectional view 600 of FIG. 6, a lateral etch stop layer 210 is formed over the passivation layer 206, and is further formed lining the trench 502 (see, e.g., FIG. 5) and the passivation layer 206. The lateral etch stop layer 210 may, for example, be formed conformally lining the trench 502 and the passivation layer 206, and/or may be, for example, formed of aluminum nitride, aluminum oxide, silicon carbide, or a dielectric material that is resistant to VHF or BOE. Further, the lateral etch stop layer 210 may, for example, be formed by sputtering or vapor deposition.

Also illustrated by the cross-sectional view 600 of FIG. 6, a filler layer 212 is formed over the lateral etch stop layer 210 and the passivation layer 206, and further filling a portion of the trench 502 (see, e.g., FIG. 5) unfilled by the lateral etch stop layer 210. The filler layer 212 may be, for example, formed of silicon dioxide, some other oxide, or some other dielectric, and/or may be formed by, for example, sputtering, thermal oxidation, or vapor deposition.

Figure 7:
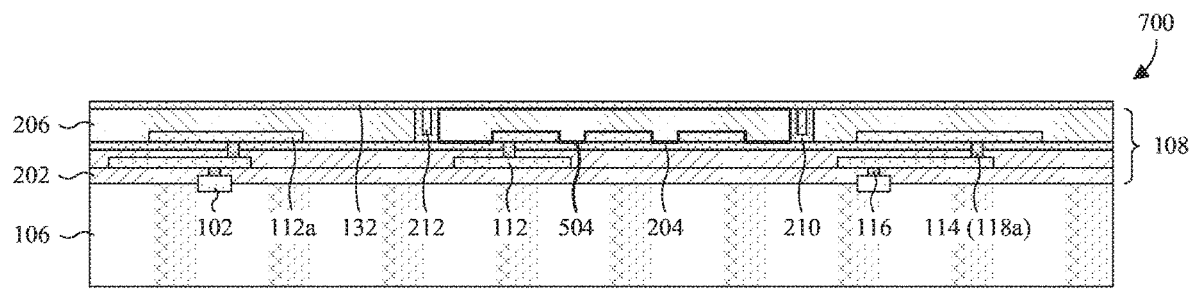

As illustrated by the cross-sectional view 700 of FIG. 7, a planarization is performed into the lateral etch stop layer 210 and the filler layer 212 to coplanarize upper or top surfaces respectively of the lateral etch stop layer 210 and the filler layer 212 with an upper or top surface of the passivation layer 206. The planarization may be, for example, performed by a CMP.

Also illustrated by the cross-sectional view 700 of FIG. 7, a seed layer 132 is formed covering the passivation layer 206, the lateral etch stop layer 210, and the filler layer 212. The seed layer 132 may, for example, be formed of aluminum nitride, aluminum oxide, silicon carbide, or a dielectric material that is resistant to VHF or BOE. Further, the seed layer 132 may, for example, be formed by sputtering or vapor deposition.

With reference to FIGS. 8A-8E, a series of cross-sectional views 800A-800E of some embodiments of a method for manufacturing the IC of FIG. 2A is provided.

Figure 8A:
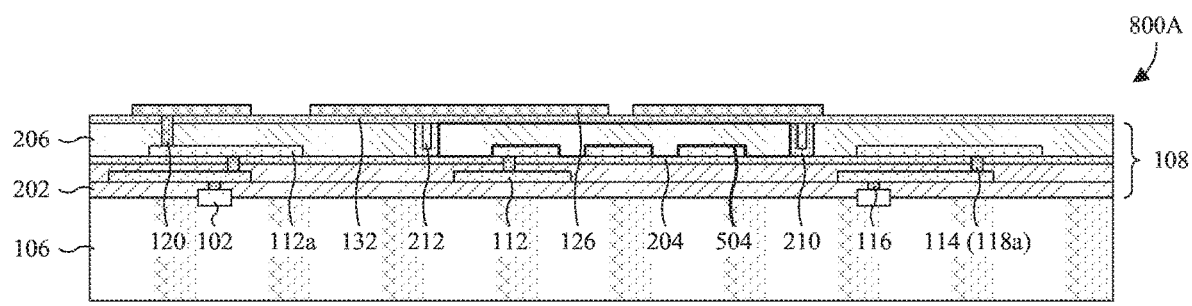

As illustrated by the cross-sectional view 800A of FIG. 8A, a first electrode layer 126 and an inter-device via layer 120 are formed. The first electrode layer 126 is formed over the seed layer 132 and the inter-device via layer 120. Further, the first electrode layer 126 is formed electrically coupled to the inter-device via layer 120, and further electrically coupled to the top wiring layer 112a by the inter-device via layer 120. The inter-device via layer 120 is formed extending through the seed layer 132 to the top wiring layer 112a. The first electrode layer 126 may, for example, be formed of molybdenum, aluminum, gold, or platinum, and the inter-device via layer 120 may, for example, be formed of tungsten. Further, the first electrode layer 126 and the inter-device via layer 120 may, for example, be formed by a dual-damascene-like process or a single damascene-like process.

Figure 8B:
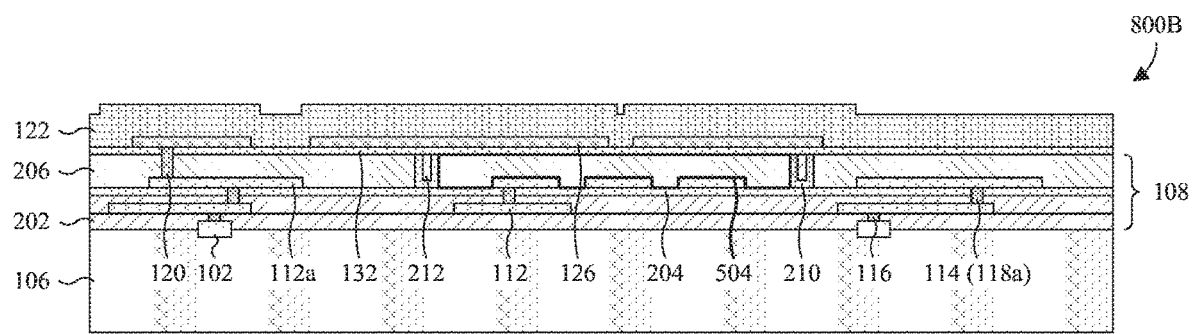

As illustrated by the cross-sectional view 800B of FIG. 8B, a piezoelectric layer 122 is formed covering the seed layer 132 and the first electrode layer 126. In some embodiments, piezoelectric layer 122 is formed of aluminum nitride, zinc oxide, or lead zirconate titanate, and/or is formed of the same material as the seed layer 132. Further, in some embodiments, the piezoelectric layer 122 is formed by sputtering or vapor deposition, and/or is grown from the seed layer 132.

Figure 8C:
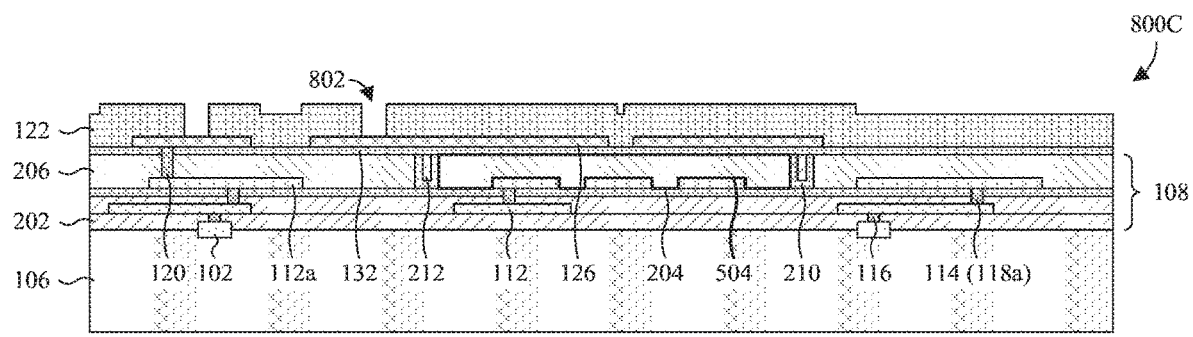

As illustrated by the cross-sectional view 800C of FIG. 8C, a second etch is performed into the piezoelectric layer 122 to form one or more through-via openings 802 exposing the first electrode layer 126. In some embodiments, the process for performing the second etch comprises forming and patterning a photoresist layer over the piezoelectric layer 122, applying an etchant to the piezoelectric layer 122 with the photoresist layer in place, and removing the photoresist layer.

Figure 8D:
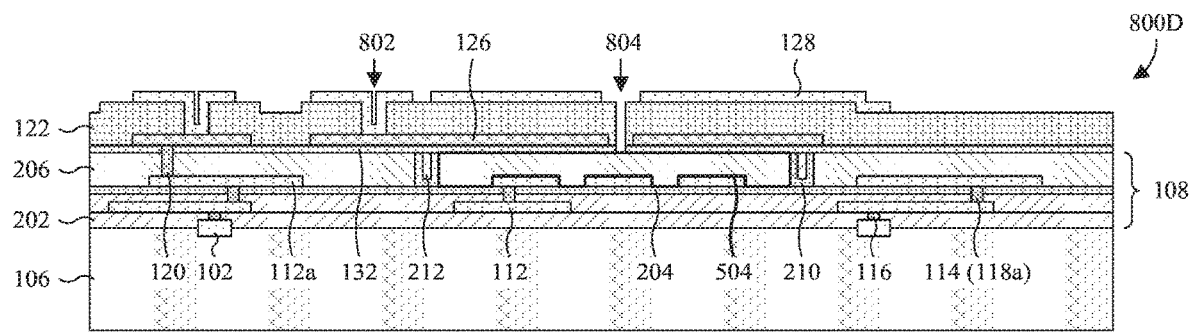

As illustrated by the cross-sectional view 800D of FIG. 8D, a second electrode layer 128 is formed over the piezoelectric layer 122. Further, the second electrode layer 128 is formed lining the through-via opening(s) 802, such that the second electrode layer 128 is electrically coupled to the first electrode layer 126. The second electrode layer 128 may, for example, be formed conformally lining the through-via opening(s) 802, and/or may, for example, be formed of aluminum copper, molybdenum, aluminum, or gold.

In some embodiments, the process for forming the second electrode layer 128 comprises depositing or growing the second electrode layer 128, and subsequently patterning the second electrode layer 128. The second electrode layer 128 may, for example, be deposited or grown by, for example, sputtering or vapor deposition. Further, the second electrode layer 128 may, for example, be patterned using photolithography.

Also illustrated by the cross-sectional view 800D of FIG. 8D, a third etch is performed into the piezoelectric layer 122 and the seed layer 132 to form a release opening 804 exposing the sacrificial dielectric region 504. In some embodiments, the process for performing the third etch comprises forming and patterning a photoresist layer over the piezoelectric layer 122 and the second electrode layer 128, applying an etchant to the piezoelectric layer 122 and the seed layer 132 with the photoresist layer in place, and removing the photoresist layer.

Figure 8E:
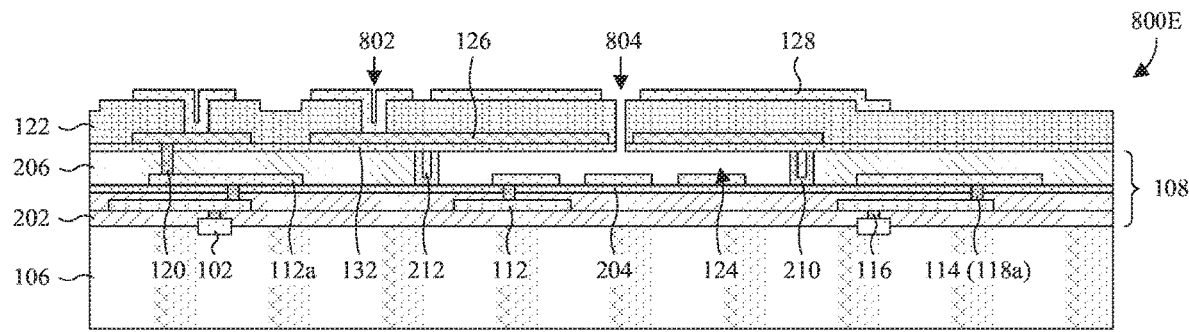

As illustrated by the cross-sectional view 800E of FIG. 8E, a fourth etch is performed into the sacrificial dielectric region 504 (see FIG. 8D), through the release opening 804, to remove the sacrificial dielectric region 504 and to form a cavity 124 in place of the sacrificial dielectric region 504. In some embodiments, the fourth etch is performed by applying an etchant to the sacrificial dielectric region 504 through the release opening 804. The etchant may be, for example, VHF or BOE. Further, in some embodiments, the vertical and lateral etch stop layers 204, 210, the seed layer 132, and the piezoelectric layer 122 are the same material and/or are resistant to the etchant, such that bounds of the cavity 124 are well defined.

With reference to FIGS. 9A-9F, a series of cross-sectional views 900A-900F of some embodiments of a method for manufacturing the IC of FIG. 2B is provided. The embodiments of FIGS. 9A-9F may be, for example, alternatives to the embodiments of FIGS. 8A-8E, and/or may, for example, proceed from FIG. 7.

Figure 9A:
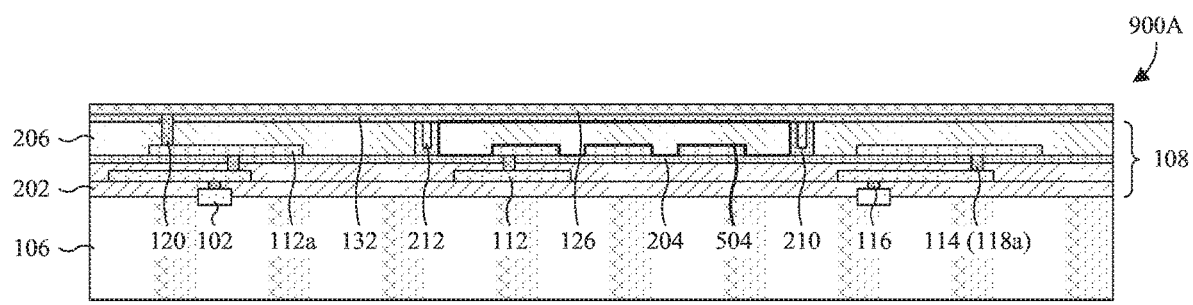

As illustrated by the cross-sectional view 900A of FIG. 9A, a first electrode layer 126 and an inter-device via layer 120 are formed. The first electrode layer 126 is formed unpatterned over the seed layer 132 and the inter-device via layer 120. Further, the first electrode layer 126 is formed electrically coupled to the inter-device via layer 120, and electrically coupled to the top wiring layer 112a by the inter-device via layer 120. The inter-device via layer 120 is formed extending through the seed layer 132 to the top wiring layer 112a.

In some embodiments, the first electrode layer 126 and the inter-device via layer 120 are formed as described with regard to FIG. 8A, except that the first electrode layer 126 is unpatterned. Further, in some embodiments, the forming process comprises performing a selective etch into the passivation layer 206 and the seed layer 132 to form one or more inter-device via openings exposing the top wiring layer 112a. Thereafter, the forming process comprises depositing or growing a conductive layer filling the inter-device via opening(s) and covering the seed layer 132, and performing a planarization into an upper or top surface of the conductive layer. In some embodiments, the planarization and the forming process conclude with the upper or top surface spaced over an upper or top surface of the seed layer 132, such that the first electrode layer 126 and the inter-device via layer 120 are integrated together in the conductive layer. In other embodiments, the planarization coplanarizes an upper or top surface of the conductive layer with an upper or top surface of the seed layer 132, such that the conductive layer is the inter-device via layer 120. In such other embodiments, the forming process further comprises depositing or growing the first electrode layer 126 over the inter-device via layer 120 and the seed layer 132.

Figure 9B:
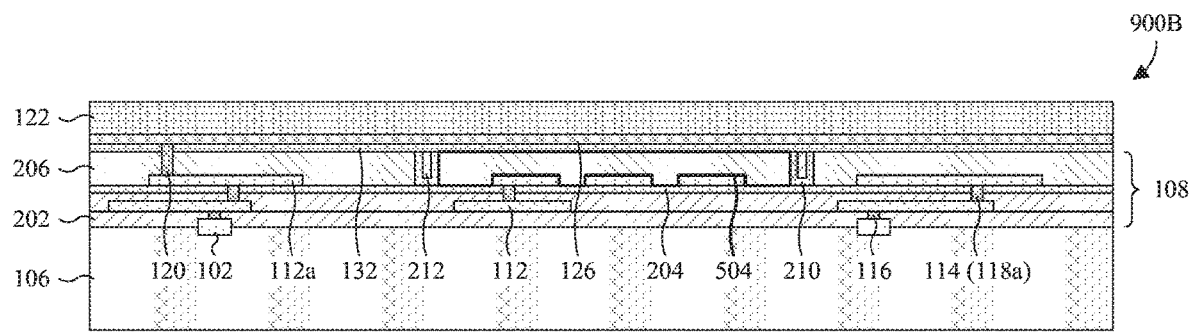

As illustrated by the cross-sectional view 900B of FIG. 9B, a piezoelectric layer 122 is formed covering the seed layer 132 and the first electrode layer 126. The piezoelectric layer 122 may, for example, be formed as described with regard to FIG. 8B.

Figure 9C:
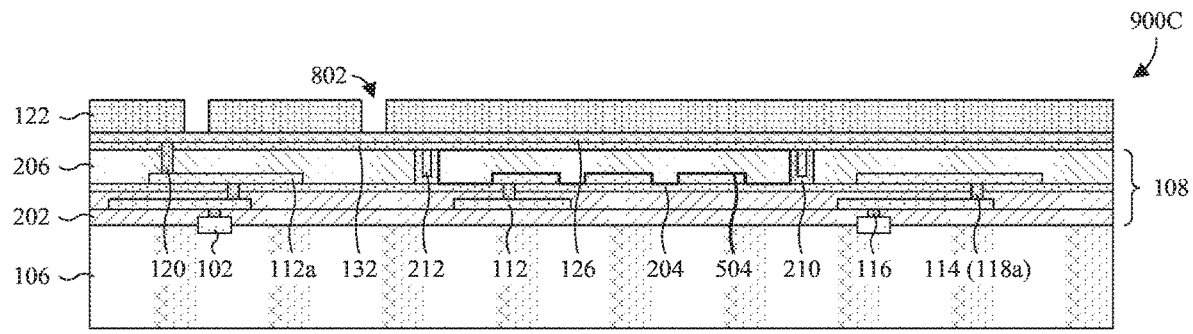

As illustrated by the cross-sectional view 900C of FIG. 9C, a second etch is performed into the piezoelectric layer 122 to form one or more through-via openings 802 exposing the first electrode layer 126. The second etch may, for example, be performed as described with regard to FIG. 8C.

Figure 9D:
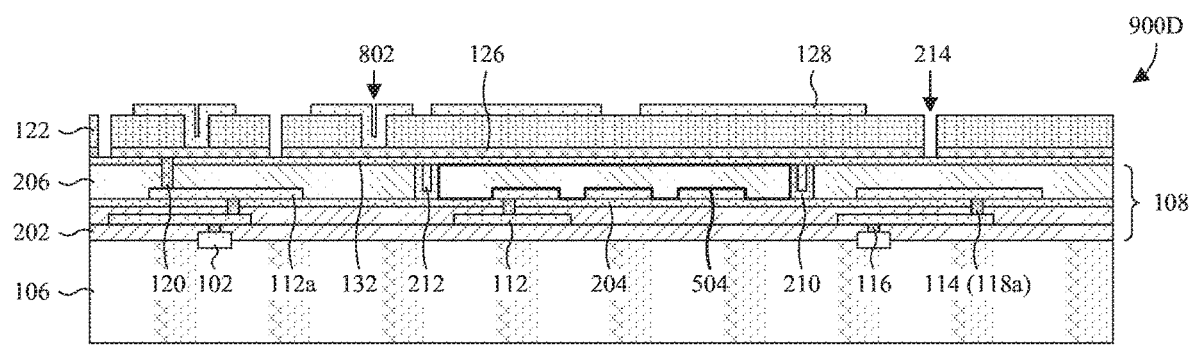

As illustrated by the cross-sectional view 900D of FIG. 9D, a second electrode layer 128 is formed over the piezoelectric layer 122. Further, the second electrode layer 128 is formed lining the through-via opening(s) 802, such that the second electrode layer 128 is electrically coupled to the first electrode layer 126. The second electrode layer 128 may, for example, be formed as described with regard to FIG. 8D.

Also illustrated by the cross-sectional view 900D of FIG. 9D, a third etch is performed into the piezoelectric layer 122 and the first electrode layer 126. The third etch patterns the first electrode layer 126 into individual electrodes, and forms isolation trenches 214 electrically isolating the individual electrodes. In some embodiments, the process for performing the third etch comprises forming and patterning a photoresist layer over the piezoelectric layer 122 and the second electrode layer 128, applying an etchant to the piezoelectric layer 122 and the first electrode layer 126 with the photoresist layer in place, and removing the photoresist layer.

Figure 9E:
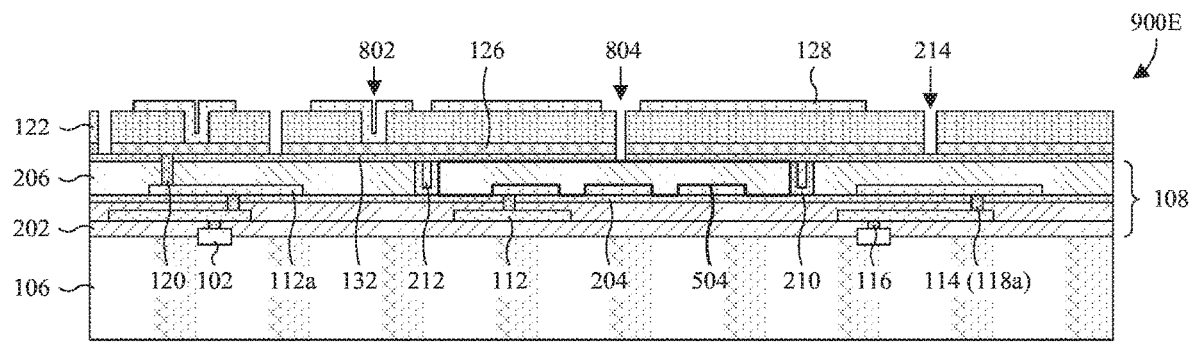

As illustrated by the cross-sectional view 900E of FIG. 9E, a fourth etch is performed into the piezoelectric layer 122, the first electrode layer 126, and the seed layer 132 to form a release opening 804 exposing the sacrificial dielectric region 504. The fourth etch may, for example, be performed as described with regard to FIG. 8D.

Figure 9F:
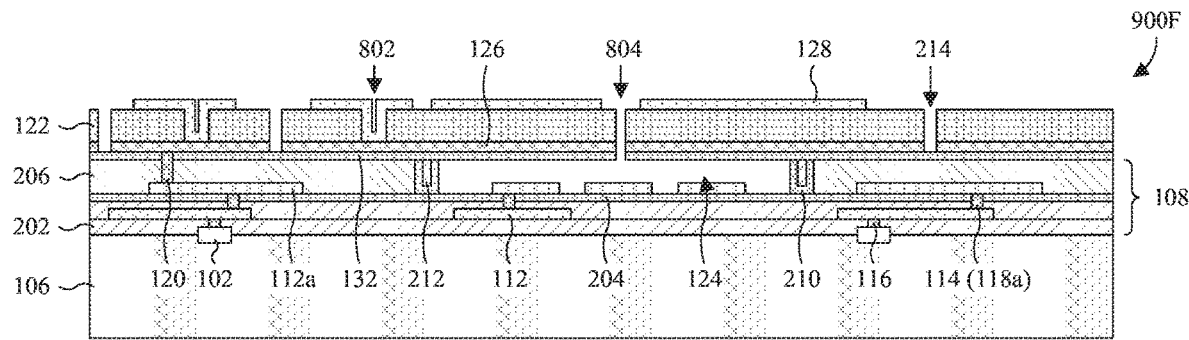

As illustrated by the cross-sectional view 900F of FIG. 9F, a fifth etch is performed into the sacrificial dielectric region 504 (see, e.g., FIG. 9E), through the release opening 804, to remove the sacrificial dielectric region 504 and to form a cavity 124 in place of the sacrificial dielectric region 504. The fifth etch may be, for example, performed as described with regard to FIG. 8E.

Advantageously, the piezoelectric layer 122 may be high quality since the first electrode layer 126 is patterned after forming the piezoelectric layer 122. For example, the piezoelectric layer 122 may have a highly uniform crystalline orientation. As a result of the high quality of the piezoelectric layer 122, the MEMS device 104 may, for example, have high performance, such as high sensitivity to external stimuli.

While the embodiments of FIGS. 3-7, 8A-8E, and 9A-9F are directed towards the ICs of FIGS. 2A and 2B, the embodiments of FIGS. 3-7, 8A-8E, and 9A-9F may be augmented to form the ICs of FIGS. 2C and 2D in other embodiments. In such other embodiments, the vertical etch stop layer 204 of FIG. 3 is omitted, and the trench 502 of FIG. 5 extends to an upper or top surface of the semiconductor substrate 106. This, in turn, expands the sacrificial dielectric region 504 of FIG. 5 to the upper or top surface of the semiconductor substrate 106. Further, in such other embodiments, the wiring and via layers 112, 114 are restricted to outside the sacrificial dielectric region 504, and the etch of FIG. 8E or 9F uses an etchant that is selective or preferential of the sacrificial dielectric region 504 relative to the semiconductor substrate 106.

With reference to FIGS. 10-18, a series of cross-sectional views 1000-1800 of some embodiments of a method for manufacturing the IC of FIG. 2E is provided.

Figure 10:
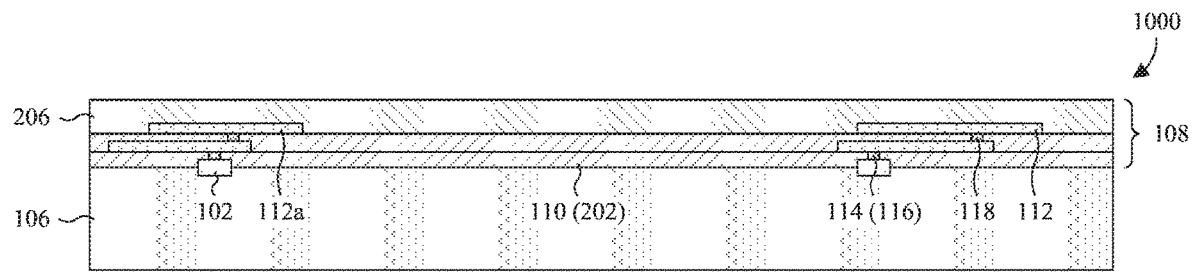

As illustrated by the cross-sectional view 1000 of FIG. 10, a CMOS IC is provided or otherwise formed. The CMOS IC comprises CMOS devices 102 arranged atop a semiconductor substrate 106, and a BEOL interconnect structure 108 covering the CMOS devices 102 and the semiconductor substrate 106. The BEOL interconnect structure 108 comprises a dielectric region 110, as well as a plurality of wiring layers 112 and a plurality of via layers 114 alternatingly stacked within the dielectric region 110. The dielectric region comprises ILD layers 202 stacked upon one another and a passivation layer 206 covering the ILD layers 202. The plurality of wiring layers 112 comprise a top wiring layer 112a electrically coupled to the CMOS devices 102 through the via layers 114 and underlying wiring layers. The via layers 114 comprise a contact via layer 116 and one or more inter-wire via layers 118.

Figure 11:
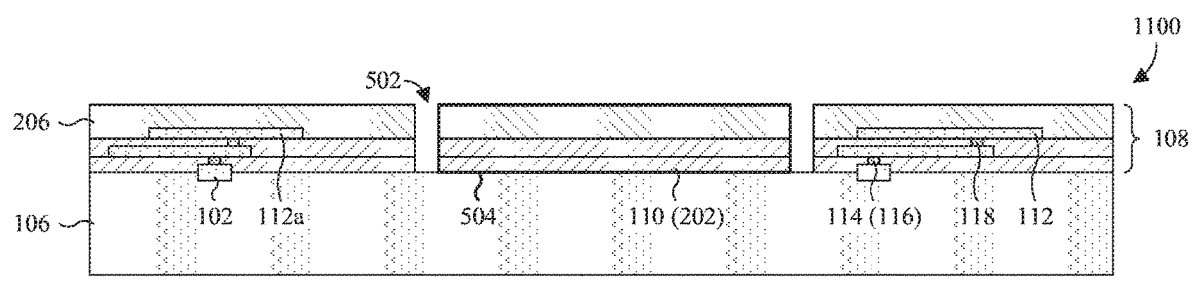

As illustrated by the cross-sectional view 1100 of FIG. 11, a first etch is performed into the passivation layer 206 and the ILD layers 202, to the semiconductor substrate 106, thereby forming a trench 502 laterally enclosing a sacrificial dielectric region 504. The first etch may, for example, be performed as described with regard to FIG. 5.

Figure 12:
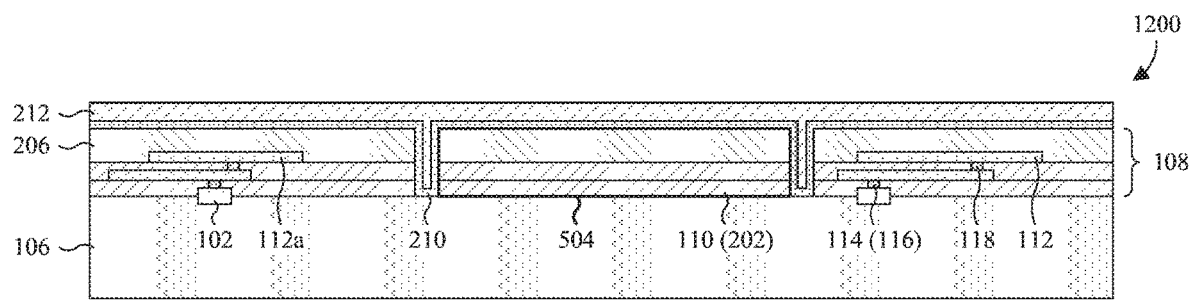

As illustrated by the cross-sectional view 1200 of FIG. 12, a lateral etch stop layer 210 and a filler layer 212 are formed. The lateral etch stop layer 210 is formed over the passivation layer 206, and is further formed lining the trench 502 and the passivation layer 206. The filler layer 212 is formed over the lateral etch stop layer 210 and the passivation layer 206, and further filling a portion of the trench 502 unfilled by the lateral etch stop layer 210. The lateral etch stop layer 210 and the filler layer 212 may, for example, be formed as described with regard to FIG. 6.

Figure 13:
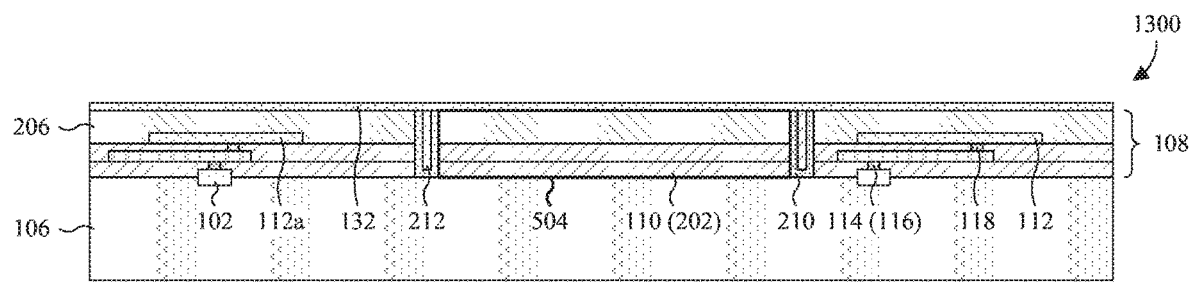

As illustrated by the cross-sectional view 1300 of FIG. 13, a planarization is performed into the lateral etch stop layer 210 and the filler layer 212 to coplanarize upper or top surfaces respectively of the lateral etch stop layer 210 and the filler layer 212 with an upper or top surface of the passivation layer 206. The planarization may, for example, be performed as described with regard to FIG. 7.

Also illustrated by the cross-sectional view 1300 of FIG. 13, a seed layer 132 is formed covering the passivation layer 206, the lateral etch stop layer 210, and the filler layer 212. The seed layer 132 may, for example, be formed as described with regard to FIG. 7.

Figure 14:
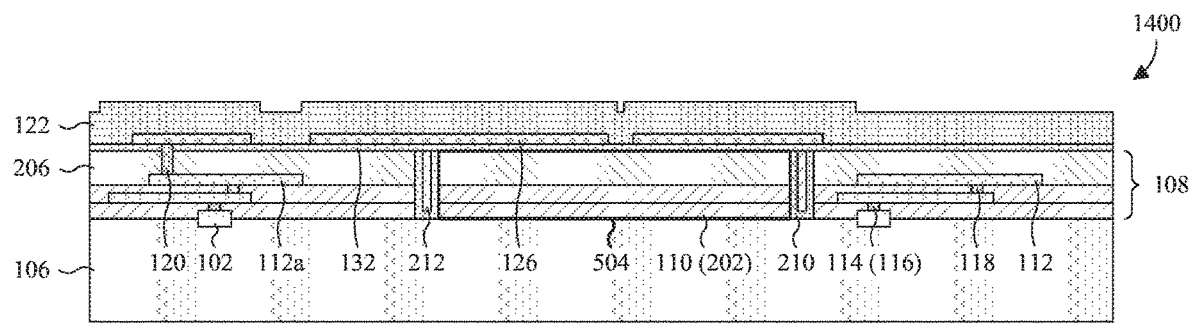

As illustrated by the cross-sectional view 1400 of FIG. 14, a first electrode layer 126 and an inter-device via layer 120 are formed. The first electrode layer 126 is formed over the seed layer 132 and the inter-device via layer 120. Further, the first electrode layer 126 is formed electrically coupled to the inter-device via layer 120, and further electrically coupled to the top wiring layer 112a by the inter-device via layer 120. The inter-device via layer 120 is formed extending through the seed layer 132 to the top wiring layer 112a. The first electrode layer 126 and the inter-device via layer 120 may, for example, be formed as described with regard to FIG. 8A.

Also illustrated by the cross-sectional view 1400 of FIG. 14, a piezoelectric layer 122 is formed covering the seed layer 132 and the first electrode layer 126. The piezoelectric layer 122 may, for example, be formed as described with regard to FIG. 8B.

Figure 15:
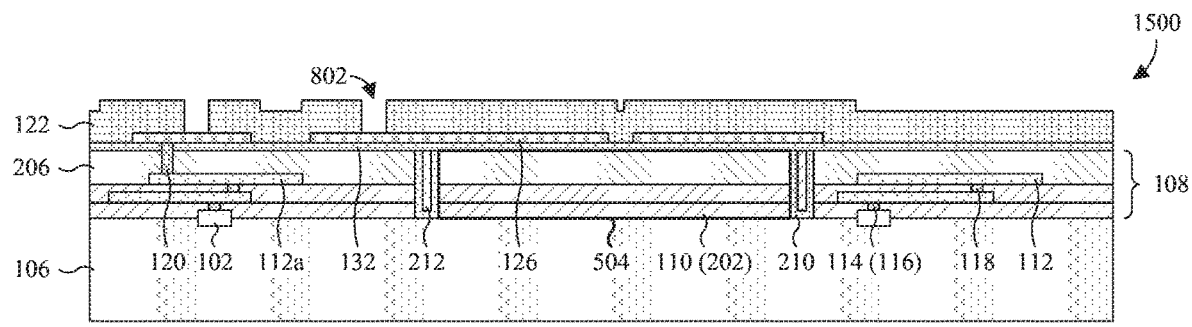

As illustrated by the cross-sectional view 1500 of FIG. 15, a second etch is performed into the piezoelectric layer 122 to form one or more through-via openings 802 exposing the first electrode layer 126. The second etch may, for example, be performed as described with regard to FIG. 8C.

Figure 16:
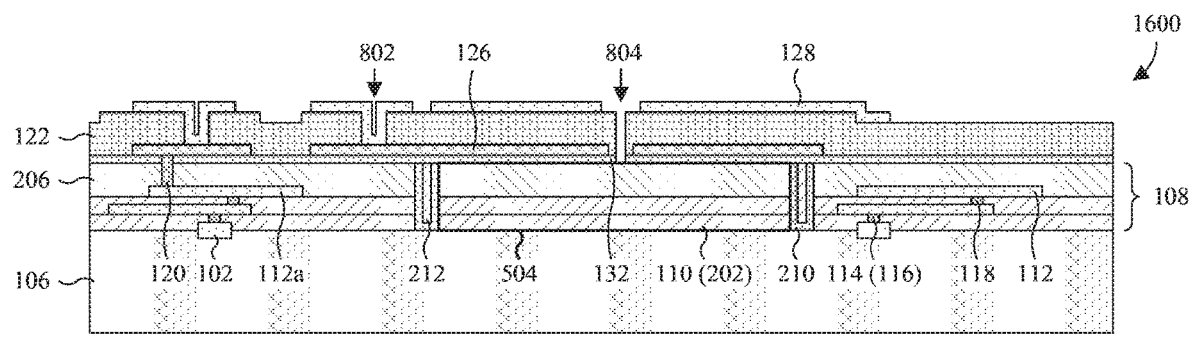

As illustrated by the cross-sectional view 1600 of FIG. 16, a second electrode layer 128 is formed over the piezoelectric layer 122. Further, the second electrode layer 128 is formed lining the one or more through-via openings 802, such that the second electrode layer 128 is electrically coupled to the first electrode layer 126. The second electrode layer 128 may, for example, be formed as described with regard to FIG. 8D.

Also illustrated by the cross-sectional view 1600 of FIG. 16, in some embodiments, a third etch is performed into the piezoelectric layer 122 and the seed layer 132 to form a release opening 804 exposing the sacrificial dielectric region 504. The third etch may, for example, be performed as described with regard to FIG. 8D.

Figure 17:
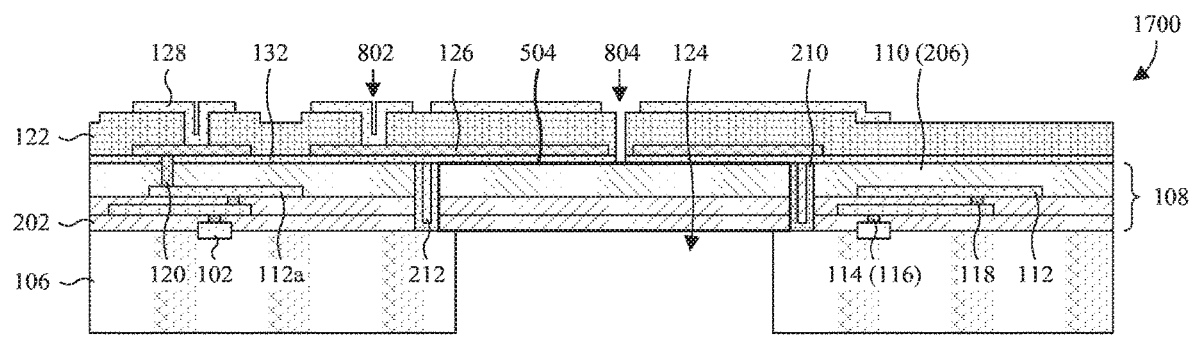

As illustrated by the cross-sectional view 1700 of FIG. 17, a fourth etch is performed into the semiconductor substrate 106 to form a cavity 124 exposing the sacrificial dielectric region 504. Further, the cavity 124 is formed laterally enclosed by the semiconductor substrate 106. In some embodiments, the process for performing the fourth etch comprises rotating the structure of FIG. 16 so the semiconductor substrate 106 overlies the BEOL interconnect structure 108. Further, the process comprises forming and patterning a photoresist layer over the semiconductor substrate 106, applying an etchant to the semiconductor substrate 106 with the photoresist layer in place, and removing the photoresist layer.

Figure 18:
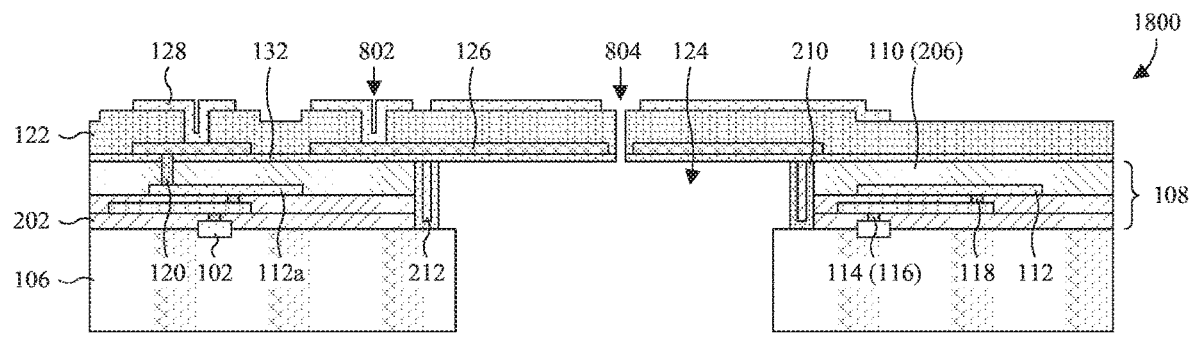

As illustrated by the cross-sectional view 1800 of FIG. 18, a fifth etch is performed into the sacrificial dielectric region 504 (see, e.g., FIG. 17), through the release opening 804 and/or the cavity 124, to remove the sacrificial dielectric region 504 and to expand the cavity 124. In some embodiments, the fifth etch is performed by applying an etchant to the sacrificial dielectric region 504 through the release opening 804 and/or the cavity 124. The etchant may be, for example, VHF or BOE. Further, in some embodiments, the lateral etch stop layer 210, the seed layer 132, and the piezoelectric layer 122 are the same material, and/or the lateral etch stop layer 210, the seed layer 132, the piezoelectric layer 122, and the semiconductor substrate 106 are resistant to the etchant.

Advantageously, the methods of FIGS. 3-7, 8A-8E, 9A-9F, and 10-18 form MEMS devices 104 and CMOS devices 102 integrated together without the use of wire bonding, such that parasitic capacitance therebetween may be low. Further, the methods may advantageously be performed at the wafer level for low packaging time and low packaging complexity. Further yet, the methods are advantageously monolithic in that the CMOS devices 102 are directly formed on semiconductor substrates (e.g., wafers) 106 of the CMOS devices 102, without the use of sacrificial substrates or bonding. Further yet, by forming cavities 124 of the MEMS devices 104 in BEOL interconnect structures 108 of the CMOS devices 102, and by using vertical and lateral etch stop layers 204, 210, bounds of the cavities 124 are advantageously well defined and the cavities 124 may advantageously be large. Further yet, the methods may be used to form microphones or other MEMS devices dependent on cavities 124 that extend through semiconductor substrates 106.

Figure 19:
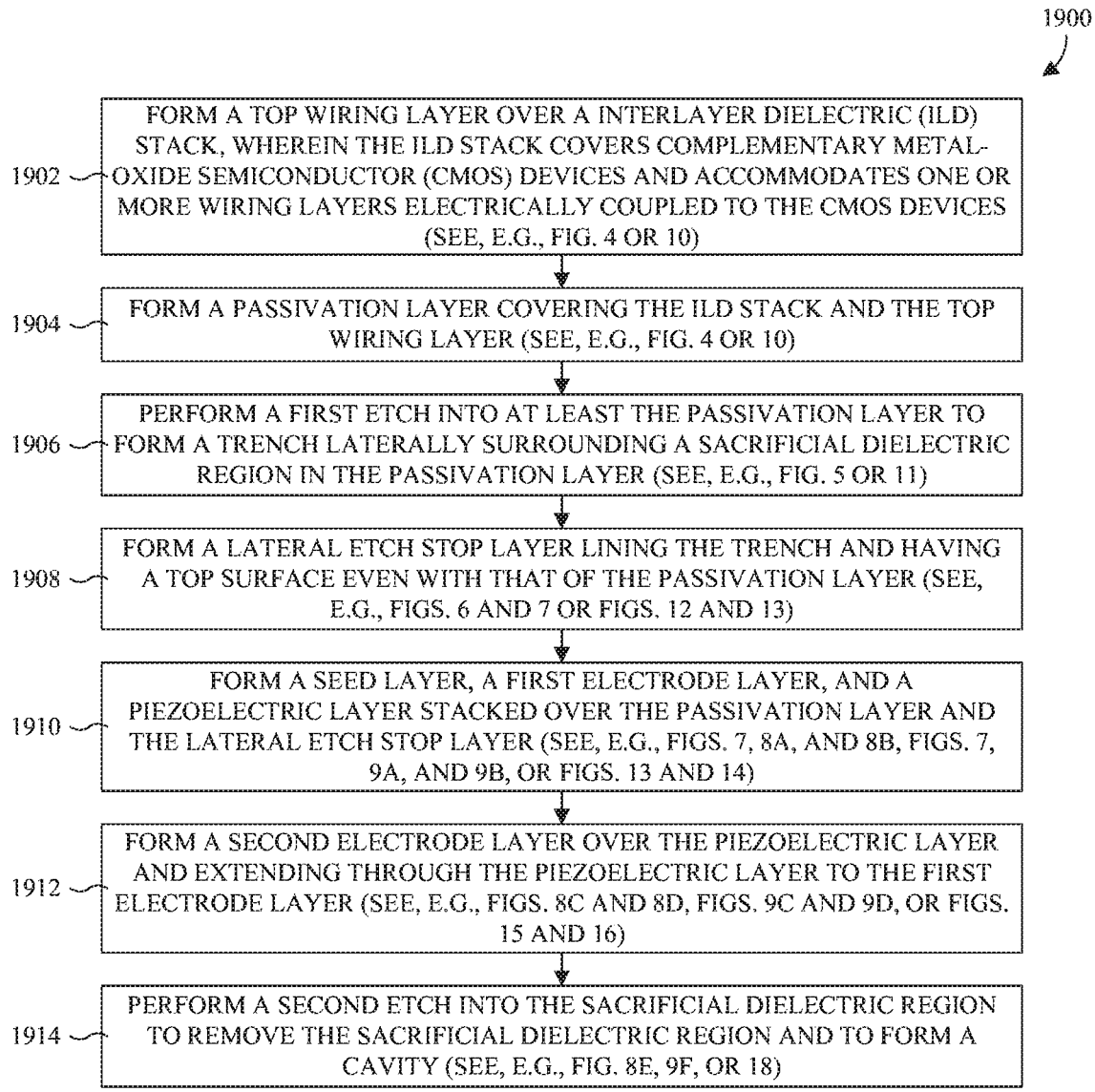
FIG. 19 illustrates a flowchart of some embodiments of the methods of FIGS. 3-7, 8A-8E, 9A-9F, and 10-18.

With reference to FIG. 19, a flowchart 1900 of some embodiments of the methods of FIGS. 3-7, 8A-8E, 9A-9F, and 10-18 is provided.

At 1902, a top wiring layer is formed over an ILD stack, where the ILD stack covers CMOS devices and accommodates one or more wiring layers electrically coupled to the CMOS devices. See, for example, FIG. 4 or 10.

At 1904, a passivation layer is formed covering the ILD stack and the top wiring layer. See, for example, FIG. 4 or 10.

At 1906, a first etch is performed into at least the passivation layer to form a trench laterally surrounding a sacrificial dielectric region in the passivation layer. See, for example, FIG. 5 or 11.

At 1908, a lateral etch stop layer is formed lining the trench and having a top surface even with that of the passivation layer. See, for example, FIGS. 6 and 7 or FIGS. 12 and 13.

At 1910, a seed layer, a first electrode layer, and a piezoelectric layer are formed stacked over the passivation layer and the lateral etch stop layer. See, for example, FIGS. 7, 8A, and 8B, FIGS. 7, 9A, and 9B, or FIGS. 13 and 14.

At 1912, a second electrode layer is formed over the piezoelectric layer and extending through the piezoelectric layer to the first electrode layer. See, for example, FIGS. 8C and 8D, FIGS. 9C and 9D, or FIGS. 15 and 16.

At 1914, a second etch is performed into the sacrificial dielectric region to remove the sacrificial dielectric region and to form a cavity. See, for example, FIG. 8E, 9F, or 18.

While the methods described by the flowchart 1900 are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 20, 21, 22A-22I, 23A-23K, a series of cross-sectional views 2000, 2100, 2200A-2200I, 2300A-2300K of some embodiments of methods for manufacturing the ICs of FIGS. 2F and 2G is provided.

Figure 20:
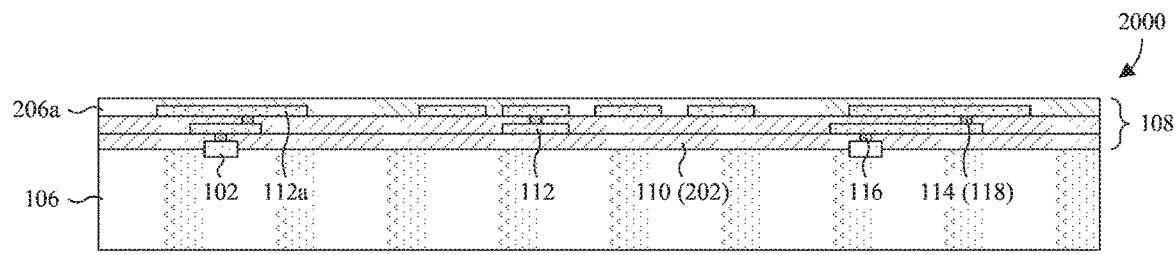
FIGS. 20, 21, 22A-22I, 23A-23K, and 24-31 illustrate a series of cross-sectional views of some embodiments of methods for manufacturing the ICs of FIGS. 2F-2H.

As illustrated by the cross-sectional view 2000 of FIG. 20, a CMOS IC is provided or otherwise formed. The CMOS IC comprises CMOS devices 102 arranged atop a semiconductor substrate 106, and a BEOL interconnect structure 108 covering the CMOS devices 102 and the semiconductor substrate 106. The BEOL interconnect structure 108 comprises a dielectric region 110, as well as a plurality of wiring layers 112 and a plurality of via layers 114 alternatingly stacked within the dielectric region 110. The dielectric region comprises ILD layers 202 stacked upon one another and a first passivation layer 206a covering the ILD layers 202. The plurality of wiring layers 112 comprise a top wiring layer 112a electrically coupled to the CMOS devices 102 through underlying wiring layers and the via layers 114. The via layers 114 comprise a contact via layer 116 and one or more inter-wire via layers 118.

Figure 21:
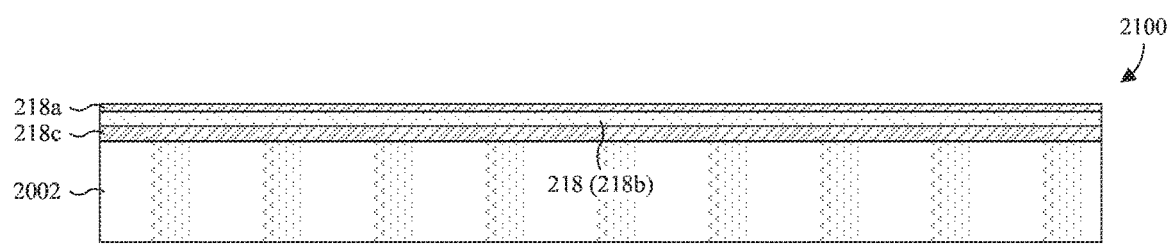

As illustrated by the cross-sectional view 2100 of FIG. 21, one or more capping layers 218 are formed stacked over and covering a sacrificial substrate 2002. The sacrificial substrate 2002 may be, for example, a bulk substrate of monocrystalline silicon or a bulk substrate of some other semiconductor. The process for forming the capping layer(s) 218 may, for example, comprise sequentially depositing and/or growing the individual capping layers 218a, 218b, 218c by sputtering, thermal oxidation, vapor deposition, or a combination of the foregoing.

In some embodiments, the capping layer(s) 218 are formed with a first capping layer 218a, a second capping layer 218b underlying the first capping layer 218a, and a third capping layer 218c underlying the second capping layer 218b. Further, in some embodiments, the first and third capping layers 218a, 218c are formed of the same material, and the second capping layer 218b is formed of a different material than the first and third capping layers 218a, 218c. For example, the first and third capping layers 218a, 218c may be formed of silicon dioxide or some other dielectric, and/or the second capping layer 218b may be formed of polysilicon. In other embodiments, the capping layer(s) 218 are formed with only the first capping layer 218a. In yet other embodiments, the capping layer(s) 218 are formed with only the first and second capping layers 218a, 218b.

With reference to FIGS. 22A-22I, a series of cross-sectional views 2200A-2200I of some embodiments of a method for manufacturing the IC of FIG. 2F is provided.

Figure 22A:
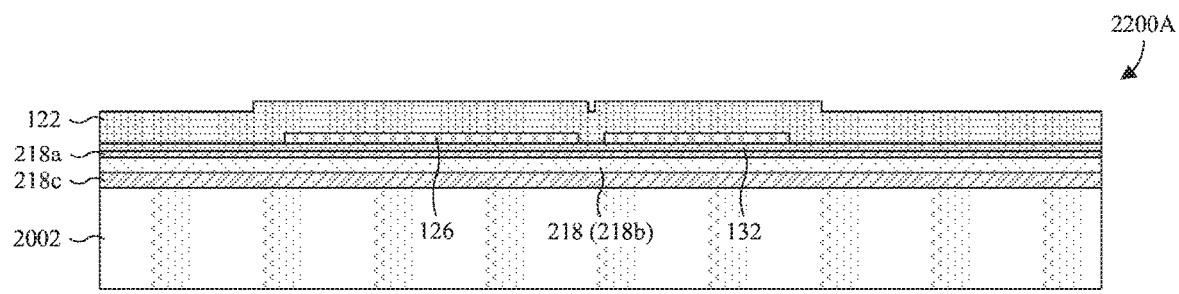

As illustrated by the cross-sectional view 2200A of FIG. 22A, a seed layer 132 is formed covering the capping layer(s) 218. The seed layer 132 may, for example, be formed of aluminum nitride, aluminum oxide, silicon carbide, or a dielectric material that is resistant to VHF or BOE. Further, the seed layer 132 may, for example, be formed by sputtering or vapor deposition.

Also illustrated by the cross-sectional view 2200A of FIG. 22A, a first electrode layer 126 is formed over the seed layer 132, and is further formed with a plurality of individual electrodes. In some embodiments, the first electrode layer 126 is formed of molybdenum, aluminum, gold, or platinum. Further, in some embodiments, the process for forming the first electrode layer 126 comprises depositing or growing the first electrode layer 126 covering the seed layer 132, and subsequently patterning the first electrode layer 126. The first electrode layer 126 may, for example, be deposited or grown by, for example, sputtering or vapor deposition, and the first electrode layer 126 may, for example, be patterned using photolithography.

Also illustrated by the cross-sectional view 2200A of FIG. 22A, a piezoelectric layer 122 is formed covering the seed layer 132 and the first electrode layer 126. In some embodiments, the piezoelectric layer 122 is formed of aluminum nitride, zinc oxide, or lead zirconate titanate, and/or is formed of the same material as the seed layer 132. Further, in some embodiments, the piezoelectric layer 122 is formed by sputtering or vapor deposition, and/or is grown from the seed layer 132.

Figure 22B:
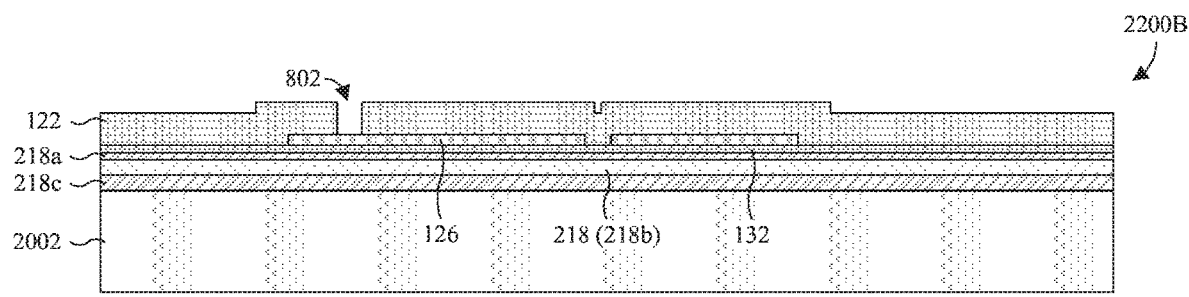

As illustrated by the cross-sectional view 2200B of FIG. 22B, a first etch is performed into the piezoelectric layer 122 to form one or more first through-via openings 802 exposing the first electrode layer 126. In some embodiments, the process for performing the first etch comprises forming and patterning a photoresist layer over the piezoelectric layer 122, applying an etchant to the piezoelectric layer 122 with the photoresist layer in place, and removing the photoresist layer.

Figure 22C:
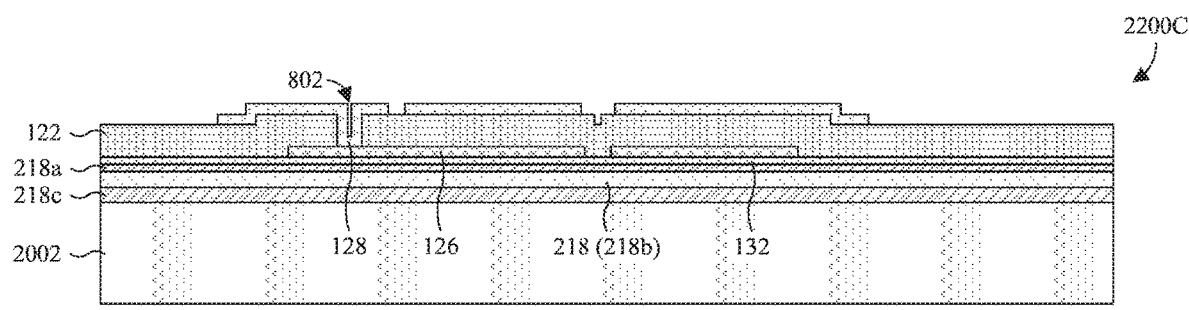

As illustrated by the cross-sectional view 2200C of FIG. 22C, a second electrode layer 128 is formed over the piezoelectric layer 122. Further, the second electrode layer 128 is formed lining the first through-via opening(s) 802, such that the second electrode layer 128 is electrically coupled to the first electrode layer 126. The second electrode layer 128 may, for example, be formed conformally lining the first through-via opening(s) 802, and/or may, for example, be formed of aluminum copper, molybdenum, aluminum, or gold.

In some embodiments, the process for forming the second electrode layer 128 comprises depositing or growing the second electrode layer 128, and subsequently patterning the second electrode layer 128. The second electrode layer 128 may, for example, be deposited or grown by, for example, sputtering or vapor deposition. Further, the second electrode layer 128 may, for example, be patterned using photolithography.

Figure 22D:
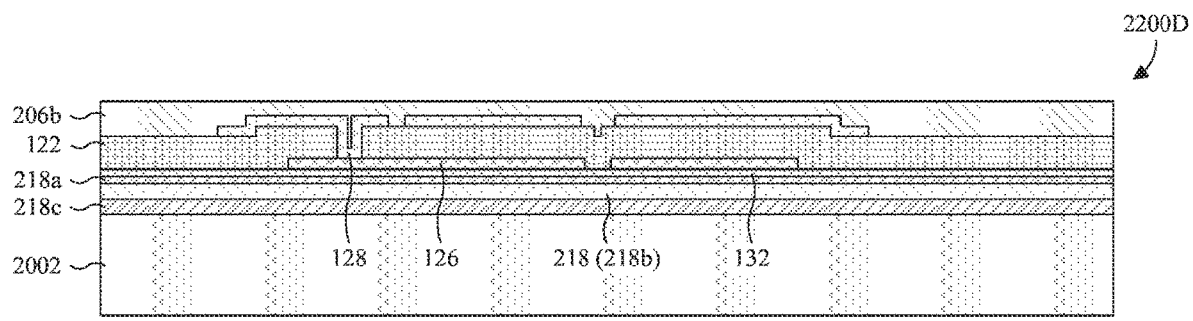

As illustrated by the cross-sectional view 2200D of FIG. 22D, a second passivation layer 206b is formed covering the piezoelectric layer 122 and the second electrode layer 128. Further, the second passivation layer 206b is formed with an upper or top surface that is planar. The second passivation layer 206b may be formed of, for example, silicon dioxide, a low κ dielectric, some other dielectric, or a combination of the foregoing.

In some embodiments, the process for forming the second passivation layer 206b comprises depositing or growing the second passivation layer 206b, and subsequently performing a planarization into the upper or top surface of the second passivation layer 206b. The second passivation layer 206b may, for example, be deposited or grown by, for example, vapor deposition, thermal oxidation, or sputtering. The planarization may, for example, be performed by a CMP.

Figure 22E:
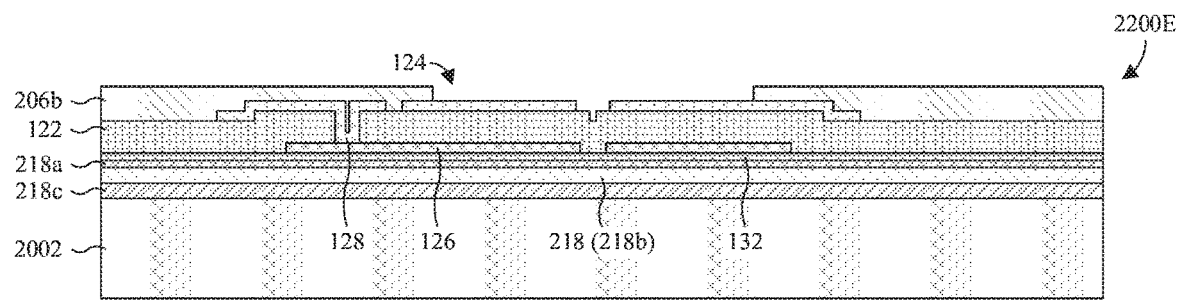

As illustrated by the cross-sectional view 2200E of FIG. 22E, a second etch is performed into the second passivation layer 206b to form a cavity 124 exposing the second electrode layer 128. In some embodiments, the process for performing the second etch comprises forming and patterning a photoresist layer over the second passivation layer 206b, applying an etchant to the second passivation layer 206b with the photoresist layer in place, and removing the photoresist layer.

Figure 22F:
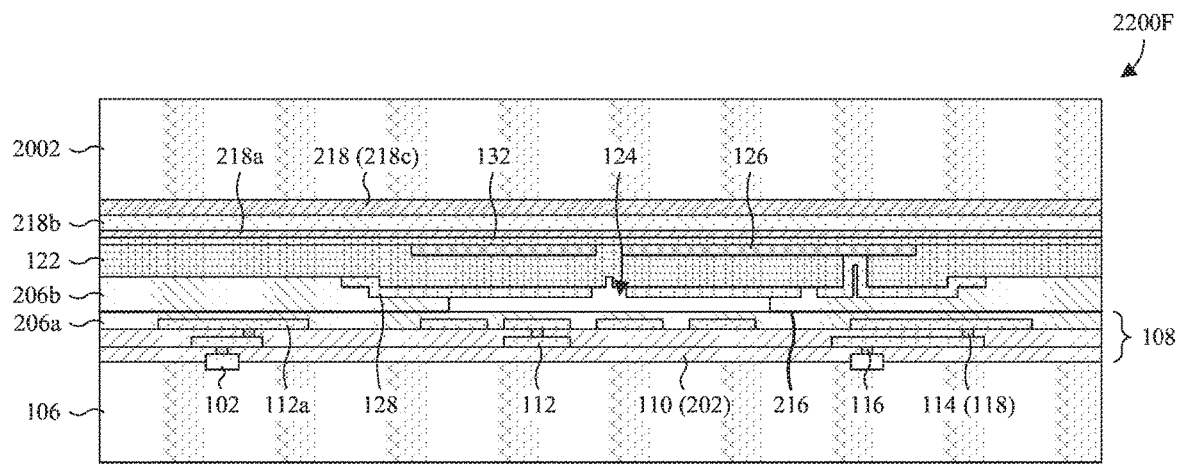

As illustrated by the cross-sectional view 2200F of FIG. 22F, the semiconductor structure of FIG. 22E is fusion bonded to the CMOS IC of FIG. 20 along a bond interface 216 between the first and second passivation layers 206a, 206b. In some embodiments, the fusion bonding is performed according to a hydrophilic fusion bonding process.

Figure 22G:
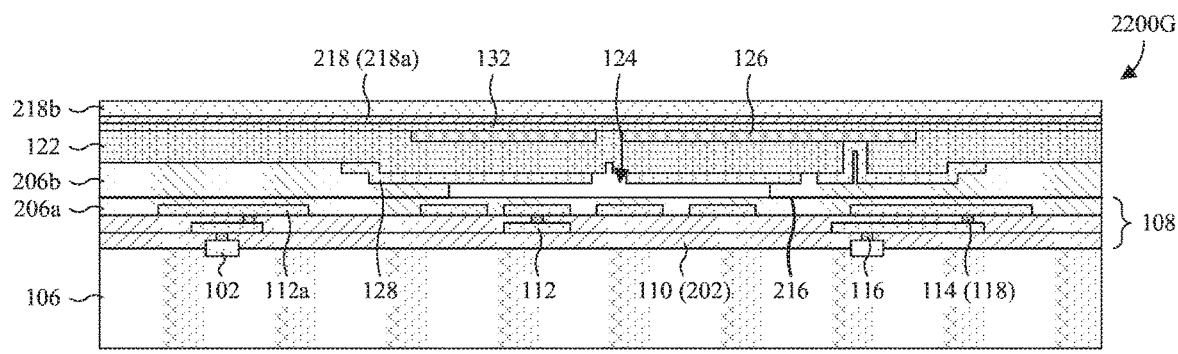

As illustrated by the cross-sectional view 2200G of FIG. 22G, the sacrificial substrate 2002 of FIG. 22F is removed. Further, in some embodiments, at least one of the capping layer(s) 218 is removed. For example, the third capping layer 218c of FIG. 22F may be removed. In some embodiments, the process for removing the sacrificial substrate 2002 and/or at least one of the capping layer(s) 218 comprises a CMP and/or an etch back.

Figure 22H:
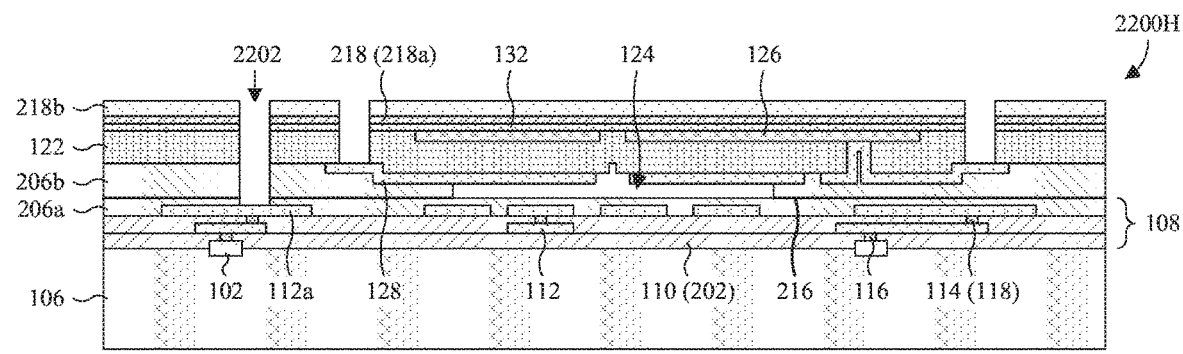

As illustrated by the cross-sectional view 2200H of FIG. 22H, a third etch is performed into the capping layer(s) 218, through the piezoelectric layer 122, to the top wiring layer 112a and the second electrode layer 128 to form a plurality of second through-via openings 2202 respectively exposing the top wiring layer 112a and the second electrode layer 128.

In some embodiments, the process for performing the third etch comprises forming and patterning a first photoresist layer over the capping layer(s) 218. In such embodiments, a first etchant is applied to the capping layer(s) 218 and the piezoelectric layer 122 with the first photoresist layer in place to form a through-via opening exposing the first electrode layer 126, and the first photoresist layer is subsequently removed. Further, in some embodiments, the process comprises forming and patterning a second photoresist layer over the capping layer(s) 218 after removing the first photoresist layer. In such embodiments, a second etchant is applied to the capping layer(s) 218, the piezoelectric layer 122, and the first and second passivation layers 206a, 206b with the second photoresist layer in place to form a through-via opening exposing the top wiring layer 112a, and the second photoresist layer is removed.

Figure 22I:
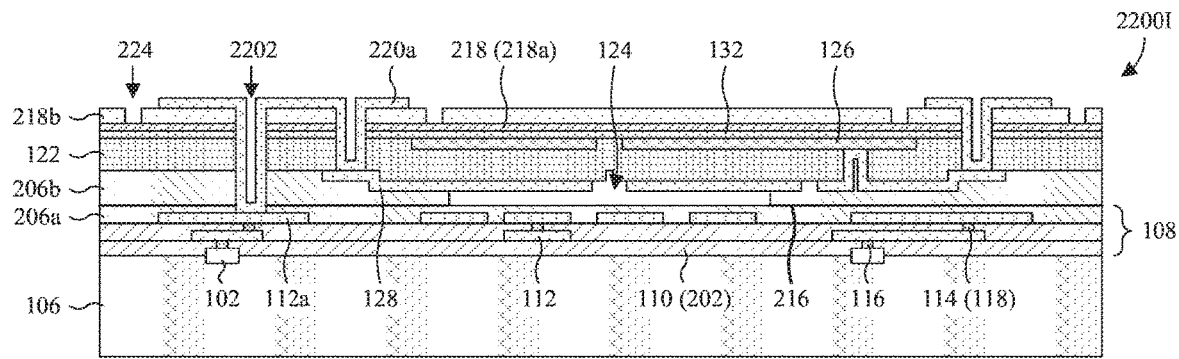

As illustrated by the cross-sectional view 2200I of FIG. 22I, a third electrode layer 220a is formed over the seed layer 132 and the capping layer(s) 218. Further, the third electrode layer 220a is formed lining the second through-via openings 2202, such that the third electrode layer 220a is electrically coupled to the top wiring layer 112a and the second electrode layer 128. The third electrode layer 220a may, for example, be formed of aluminum copper, copper, aluminum, tungsten, or some other conductive material.

In some embodiments, the process for forming the third electrode layer 220a comprises depositing or growing the third electrode layer 220a, and subsequently patterning the third electrode layer 220a. The third electrode layer 220a may, for example, be deposited or grown by, for example, sputtering or vapor deposition, and the third electrode layer 220a may, for example, be patterned using photolithography Also illustrated by the cross-sectional view 2200I of FIG. 22I, in some embodiments where the second capping layer 218b remains and is conductive, a fourth etch is performed into the second capping layer 218b. The fourth etch patterns the second capping layer 218b into individual segments, and forms isolation trenches 224 electrically isolating individual electrodes of the third electrode layer 220a, since the second capping layer 218b would otherwise short the electrodes together. In some embodiments, the process for performing the fourth etch comprises forming and patterning a photoresist layer over the second capping layer 218b and the third electrode layer 220a, applying an etchant to the second capping layer 218b with the photoresist layer in place, and removing the photoresist layer.

With reference to FIGS. 23A-23K, a series of cross-sectional views 2300A-2300K of some embodiments of a method for manufacturing the IC of FIG. 2G is provided. The embodiments of FIGS. 23A-23K may be, for example, alternatives to the embodiments of FIGS. 22A-22I, and/or may, for example, proceed from FIG. 21.

Figure 23A:
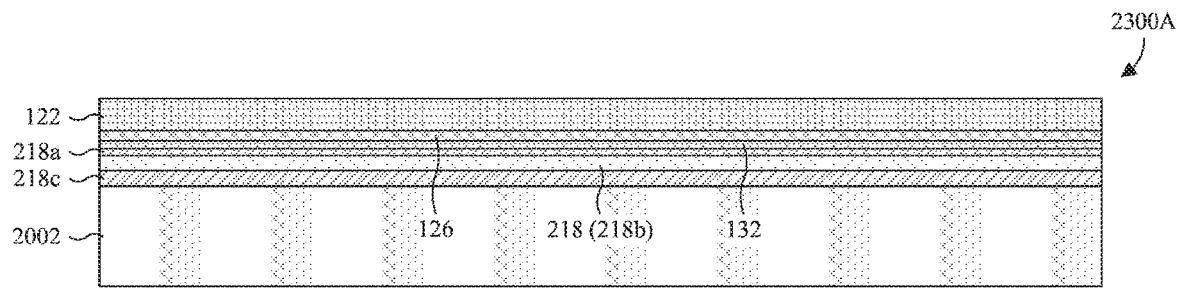

As illustrated by the cross-sectional view 2300A of FIG. 23A, a seed layer 132 is formed over the capping layer(s) 218, a first electrode layer 126 is formed over the seed layer 132, and a piezoelectric layer 122 is formed over the first electrode layer 126. Further, the first electrode layer 126 is formed unpatterned and covering the seed layer 132. In some embodiments, the seed layer 132, the first electrode layer 126, and the piezoelectric layer 122 are formed as described with regard to FIG. 22A, except the first electrode layer 126 is not patterned.

Figure 23B:
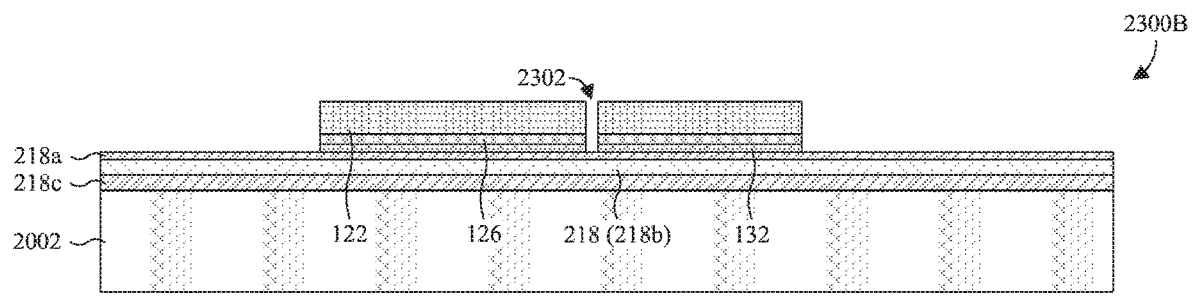

As illustrated by the cross-sectional view 2300B of FIG. 23B, a first etch is performed into the seed layer 132, the first electrode layer 126, and the piezoelectric layer 122 to remove peripheral regions laterally surrounding a device region. Further, in some embodiments, the first etch forms a device opening 2302 in the device region. In some embodiments, the process for performing the first etch comprises forming and patterning a photoresist layer over the piezoelectric layer 122, and applying an etchant to the seed layer 132, the first electrode layer 126, and the piezoelectric layer 122 with the photoresist layer in place. In such embodiments, the process further comprises removing the photoresist layer.

Figure 23C:
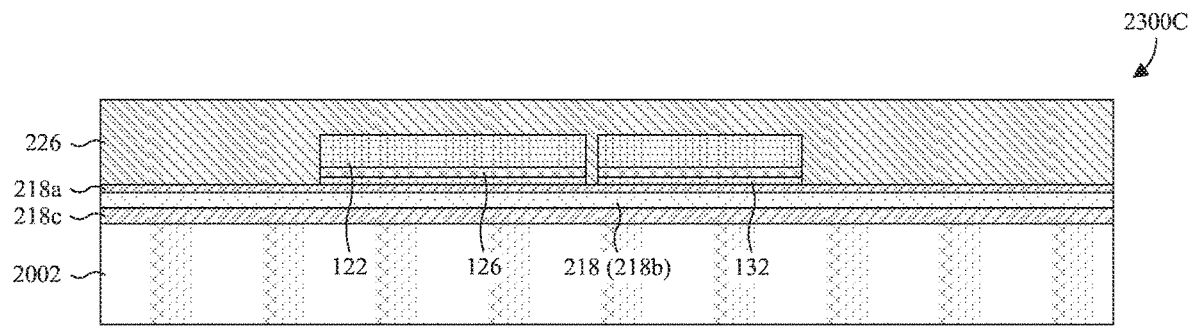

As illustrated by the cross-sectional view 2300C of FIG. 23C, an enclosing dielectric layer 226 is formed covering and laterally enclosing the seed layer 132, the first electrode layer 126, and the piezoelectric layer 122. Further, the enclosing dielectric layer 226 is formed with an upper or top surface that is planar. The enclosing dielectric layer 226 may, for example, be formed of silicon dioxide, some other oxide, or some other dielectric.

In some embodiments, the process for forming the enclosing dielectric layer 226 comprises depositing or growing the enclosing dielectric layer 226, and subsequently performing a planarization into the upper or top surface of the enclosing dielectric layer 226. The enclosing dielectric layer 226 may, for example, be deposited or growth by, for example, sputtering, vapor deposition, or thermal oxidation. Further, the planarization may, for example, be performed by a CMP.

Figure 23D:
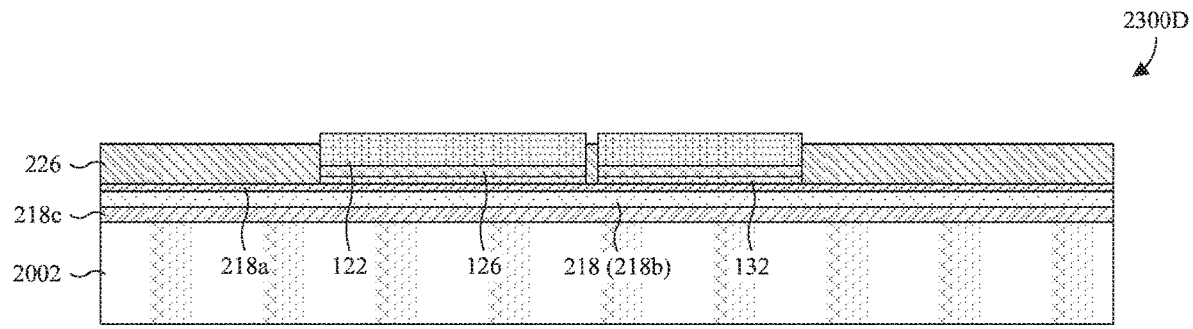

As illustrated by the cross-sectional view 2300D of FIG. 23D, a second etch is performed into the enclosing dielectric layer 226 to recess the upper or top surface of the enclosing dielectric layer 226 to a location spaced between an upper or top surface of the piezoelectric layer 122 and a lower or bottom surface of the seed layer 132. In some embodiments, the second etch comprises applying an etchant to the enclosing dielectric layer 226 for a predetermined period of time. The etchant may, for example, be selective or preferential of the enclosing dielectric layer 226 relative to the seed layer 132, the first electrode layer 126, and the piezoelectric layer 122.

Figure 23E:
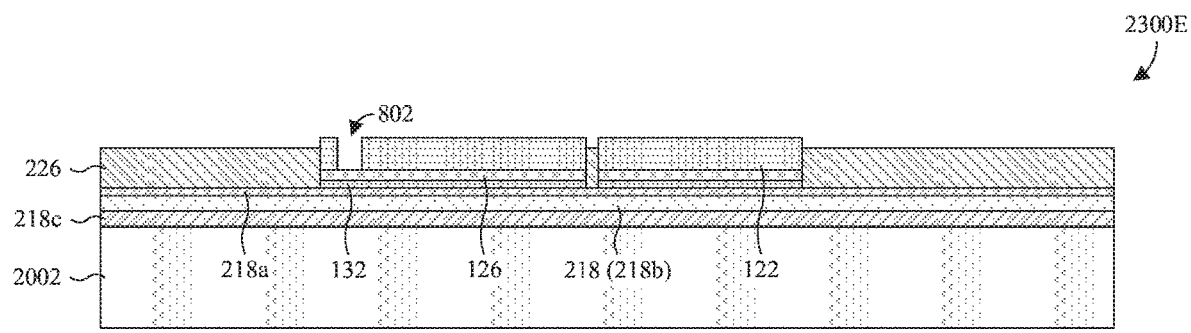

As illustrated by the cross-sectional view 2300E of FIG. 23E, a third etch is performed into the piezoelectric layer 122 to form one or more through-via openings 802 exposing the first electrode layer 126. The third etch may, for example, be performed as described with regard to FIG. 22B.

Figure 23F:
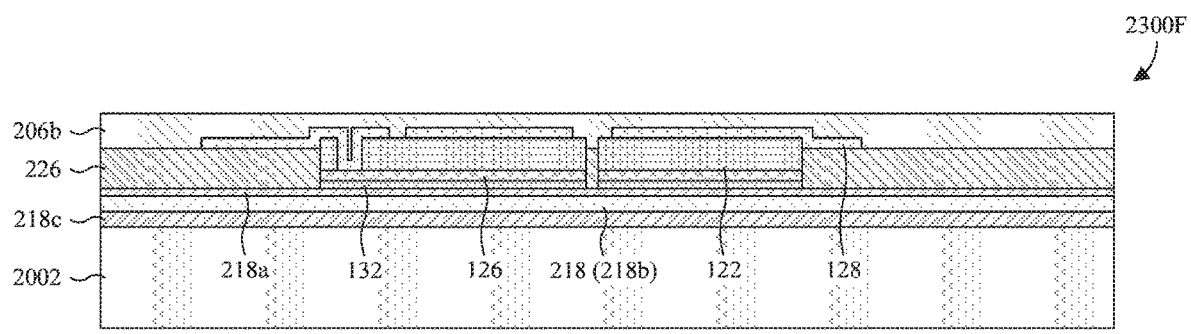

As illustrated by the cross-sectional view 2300F of FIG. 23F, a second electrode layer 128 is formed over the piezoelectric layer 122 and the enclosing dielectric layer 226. Further, the second electrode layer 128 is formed lining the through-via opening(s) 802 (see, e.g., FIG. 23E), such that the second electrode layer 128 is electrically coupled to the first electrode layer 126. The second electrode layer 128 may, for example, be formed as described with regard to FIG. 22C.

Also illustrated by the cross-sectional view 2300F of FIG. 23F, a second passivation layer 206b is formed covering the piezoelectric layer 122, the second electrode layer 128, and the enclosing dielectric layer 226. Further, the second passivation layer 206b is formed with an upper or top surface that is planar. The second passivation layer 206b may, for example, be formed as described with regard to FIG. 22D.

Figure 23G:
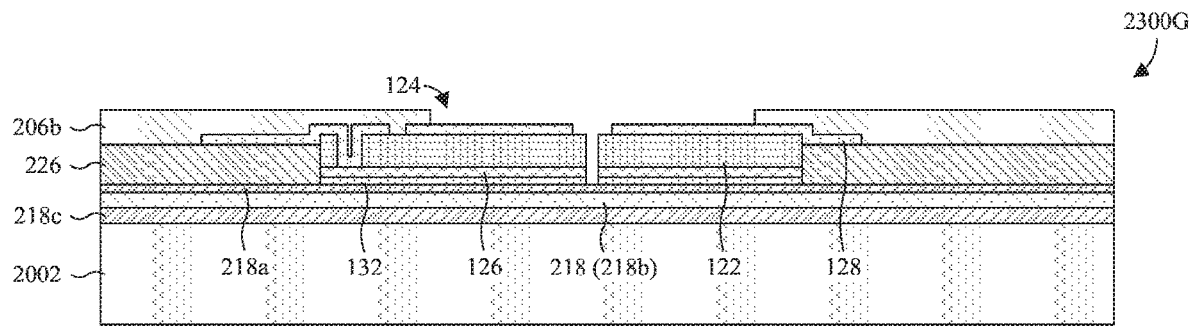

As illustrated by the cross-sectional view 2300G of FIG. 23G, a fourth etch is performed into the second passivation layer 206b to form a cavity 124 exposing the second electrode layer 128. The fourth etch may, for example, be performed as described with regard to FIG. 22E.

Figure 23H:
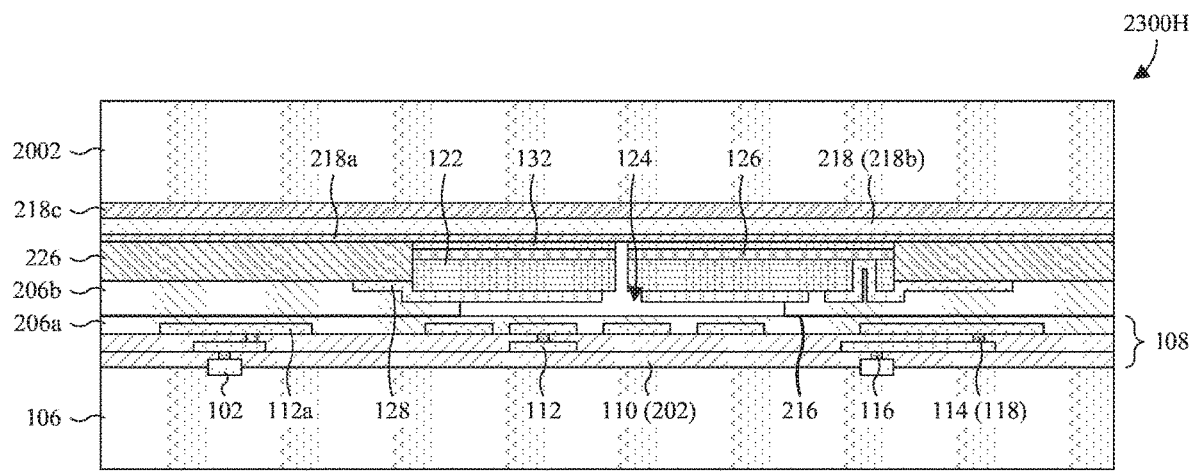

As illustrated by the cross-sectional view 2300H of FIG. 23H, the semiconductor structure of FIG. 23G is fusion bonded to the CMOS IC of FIG. 20 along a bond interface 216 between the first and second passivation layers 206a, 206b. The bonding may, for example, be performed as described with regard to FIG. 22F.

Figure 23I:
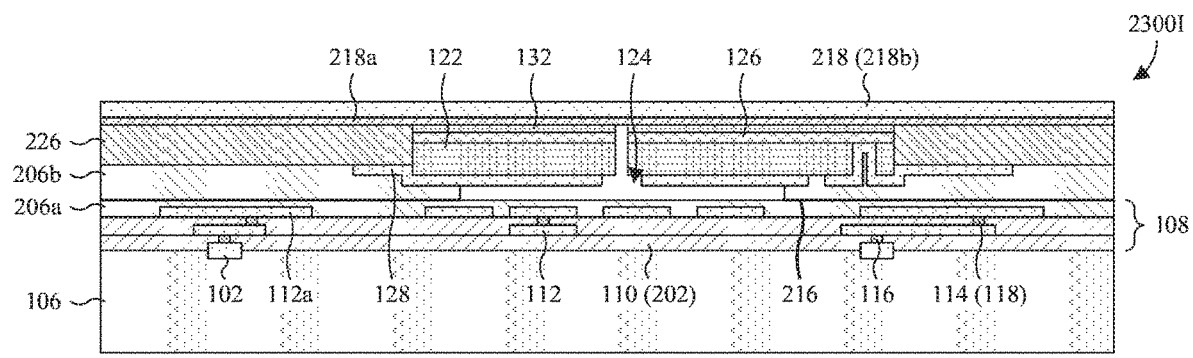

As illustrated by the cross-sectional view 2300I of FIG. 23I, the sacrificial substrate 2002 of FIG. 23H is removed. Further, in some embodiments, at least one of the capping layer(s) 218 is/are removed. The removal may, for example, be performed as described with regard to FIG. 22G.

Figure 23J:
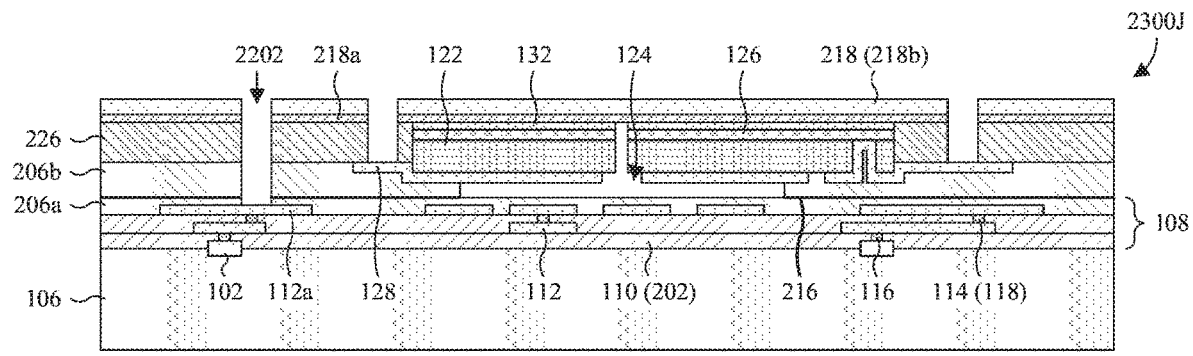

As illustrated by the cross-sectional view 2300J of FIG. 23J, a fifth etch is performed into the capping layer(s) 218, through the piezoelectric layer 122, to the top wiring layer 112a and the second electrode layer 128 to form a plurality of second through-via openings 2202 respectively exposing the top wiring layer 112a and the second electrode layer 128. The fifth etch may, for example, be performed as described with regard to FIG. 22H.

Figure 23K:
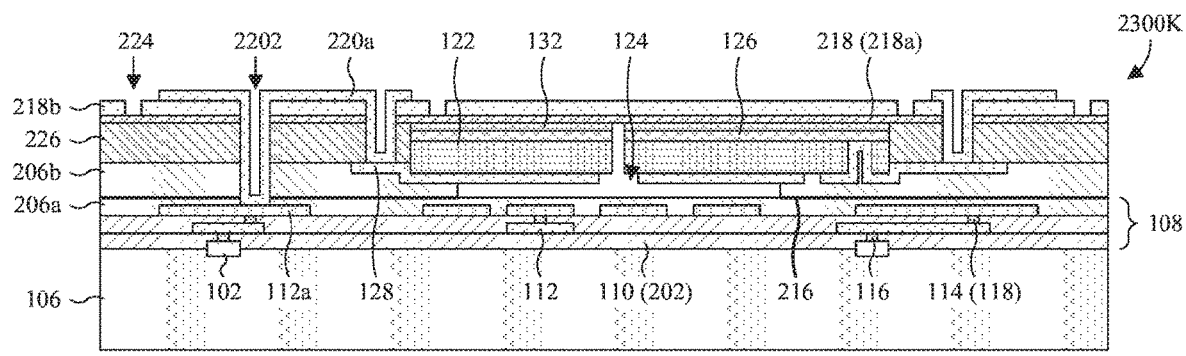

As illustrated by the cross-sectional view 2300K of FIG. 23K, a third electrode layer 220a is formed over the seed layer 132 and the capping layer(s) 218. Further, the third electrode layer 220a is formed lining the second through-via openings 2202, such that the third electrode layer 220a is electrically coupled to the top wiring layer 112a and the second electrode layer 128. The third electrode layer 220a may, for example, be formed as described with regard to FIG. 22I.

Also illustrated by the cross-sectional view 2300K of FIG. 23K, in some embodiments where the second capping layer 218b remains and is conductive, a sixth etch is performed into the second capping layer 218b. The sixth etch patterns the second capping layer 218b into individual segments, and forms isolation trenches 224 electrically isolating individual electrodes of the third electrode layer 220a, since the second capping layer 218b would otherwise short the electrodes together. The sixth etch may, for example, be performed as described with regard to FIG. 22I.

Advantageously, the piezoelectric layer 122 may be high quality since the first electrode layer 126 is patterned after forming the piezoelectric layer 122. For example, the piezoelectric layer 122 may have a highly uniform crystalline orientation. As a result of the high quality of the piezoelectric layer 122, the MEMS device 104 may, for example, have high performance, such as high sensitivity to external stimuli.

With reference to FIGS. 24-31, a series of cross-sectional views 2400-3100 of some embodiments of a method for manufacturing the IC of FIG. 2H is provided.

Figure 24:
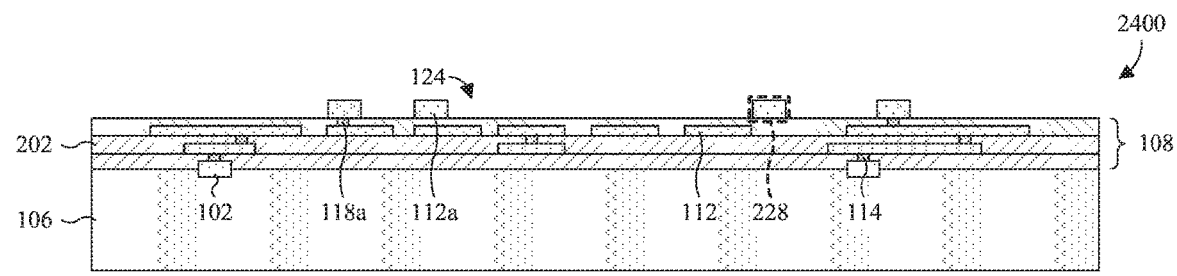

As illustrated by the cross-sectional view 2400 of FIG. 24, a top wiring layer 112a and a top inter-wire via layer 118a are formed. The top wiring layer 112a is formed over ILD layers 202 of a BEOL interconnect structure 108, and comprises a wire 228 extending laterally to enclose and define sidewalls of a cavity 124. The ILD layers 202 cover CMOS devices 102 arranged atop a semiconductor substrate 106, and further accommodate one or more wiring layers 112 and one or more via layers 114 alternatingly stacked within the ILD layers 202. The top inter-wire via layer 118a is formed extending to a wiring layer underlying the top wiring layer 112a and electrically couples the top wiring layer 112a to the CMOS devices 102. The top wiring layer 112a and the top inter-wire via layer 118a may, for example, be formed by a dual-damascene-like process or a single damascene-like process.

Figure 25:
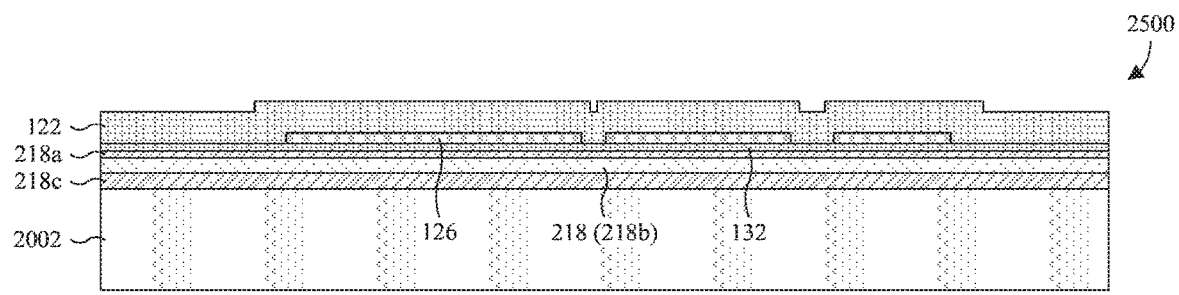

As illustrated by the cross-sectional view 2500 of FIG. 25, one or more capping layers 218 are formed stacked over and covering a sacrificial substrate 2002. In some embodiments, the capping layer(s) 218 are formed with a first capping layer 218a, a second capping layer 218b underlying the first capping layer 218a, and a third capping layer 218c underlying the second capping layer 218b. The capping layer(s) 218 may, for example, be formed as described with regard to FIG. 21.

Also illustrated by the cross-sectional view 2500 of FIG. 25, a seed layer 132 is formed over the capping layer(s) 218, a first electrode layer 126 is formed over the seed layer 132, and a piezoelectric layer 122 is formed over the first electrode layer 126. In some embodiments, the seed layer 132, the first electrode layer 126, and the piezoelectric layer 122 are formed as described with regard to FIG. 22A.

Figure 26:
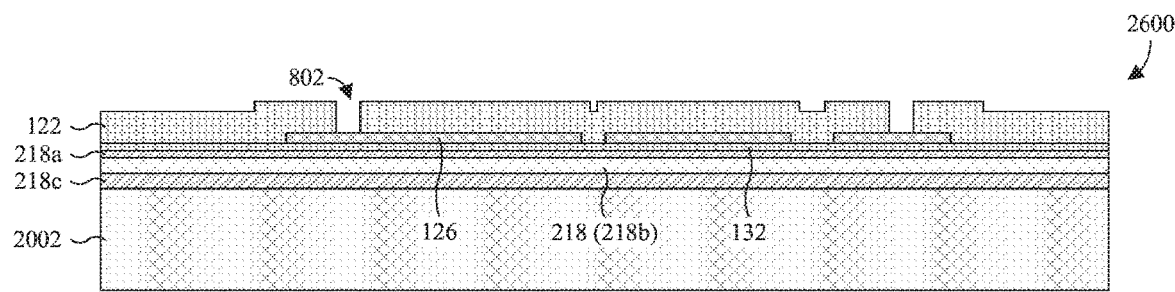

As illustrated by the cross-sectional view 2600 of FIG. 26, a first etch is performed into the piezoelectric layer 122 to form one or more first through-via openings 802 exposing the first electrode layer 126. The first etch may, for example, be performed as described with regard to FIG. 22B.

Figure 27:
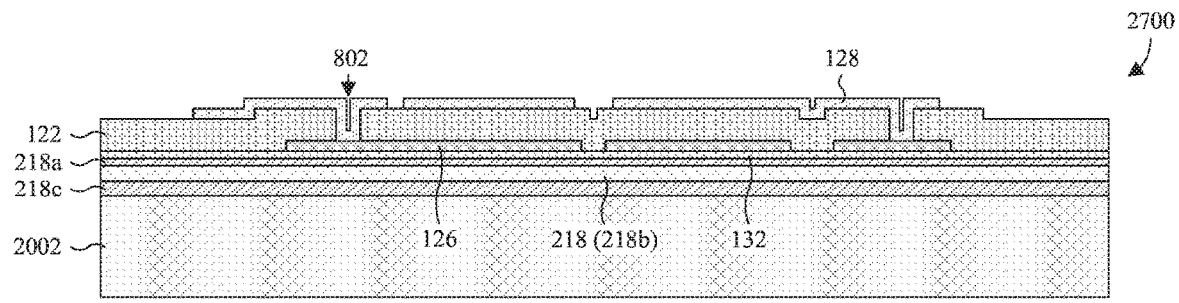

As illustrated by the cross-sectional view 2700 of FIG. 27, a second electrode layer 128 is formed over the piezoelectric layer 122. Further, the second electrode layer 128 is formed lining the first through-via opening(s) 802, such that the second electrode layer 128 is electrically coupled to the first electrode layer 126. The second electrode layer 128 may, for example, be formed as described with regard to FIG. 22C.

Figure 28:
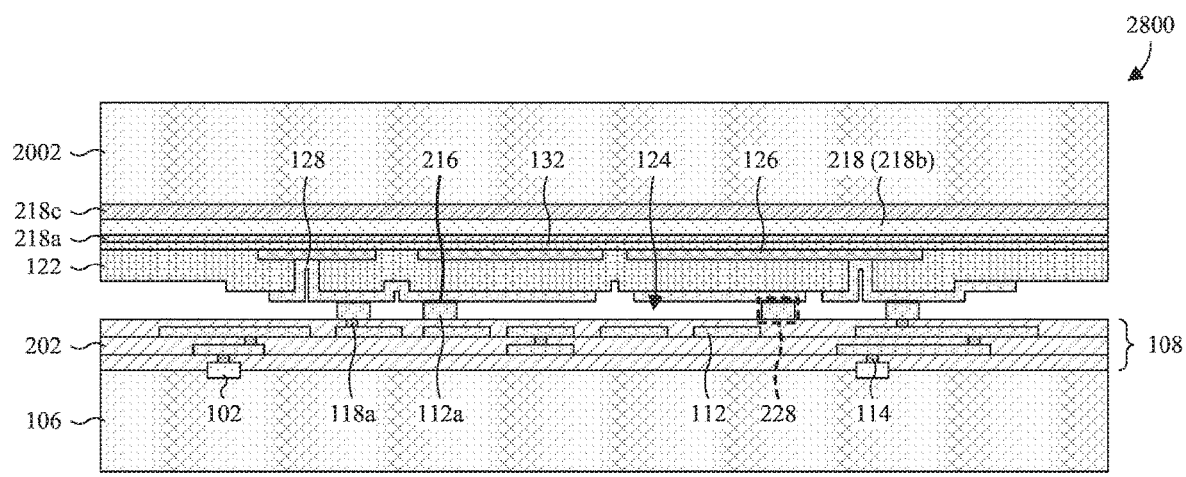

As illustrated by the cross-sectional view 2800 of FIG. 28, the semiconductor structure of FIG. 27 is eutectically or covalently bonded to the semiconductor structure of FIG. 24 along a bond interface 216 between the top wiring layer 112a and the second electrode layer 128. In some embodiments, the bonding process is a covalent bonding process in which the top wiring layer 112a and the second electrode layer 128 are aluminum copper, aluminum, gold, or doped silicon. In other embodiments, the bonding process is a eutectic bonding process in which the top wiring layer 112a and the second electrode layer 128 are respectively aluminum and germanium, respectively gold and germanium, or respectively gold and doped silicon.

Figure 29:
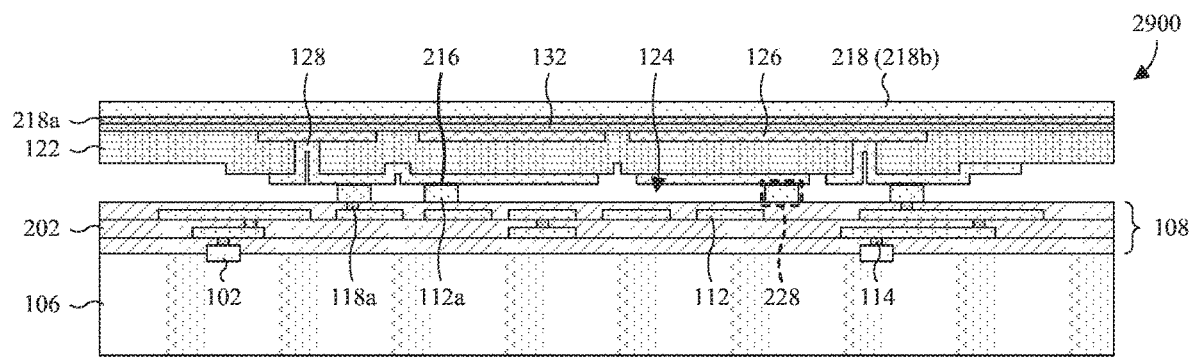

As illustrated by the cross-sectional view 2900 of FIG. 29, the sacrificial substrate 2002 of FIG. 28 is removed. Further, in some embodiments, at least one of the capping layer(s) 218 is/are removed. The removal may, for example, be performed as described with regard to FIG. 22G.

Figure 30:
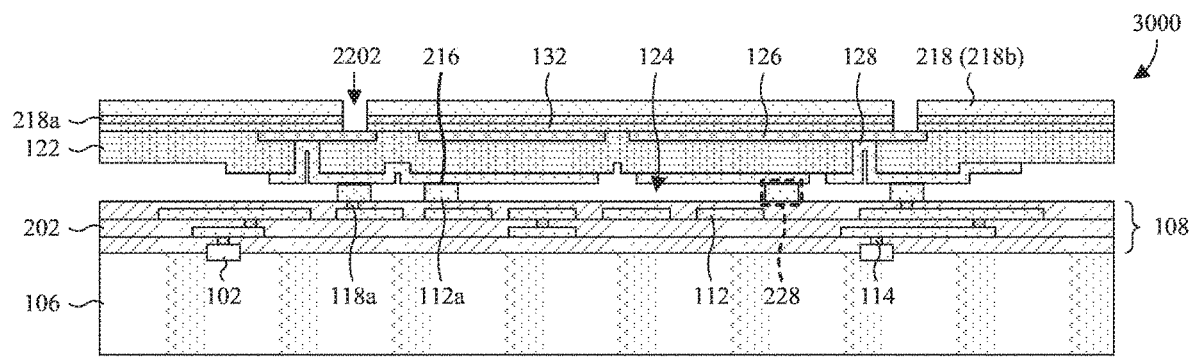

As illustrated by the cross-sectional view 3000 of FIG. 30, a second etch is performed to the first electrode layer 126, through the capping layer(s) 218 and the seed layer 132, to form a plurality of second through-via openings 2202 exposing the first electrode layer 126. In some embodiments, the process for performing the second etch comprises forming and patterning a photoresist layer over the capping layer(s) 218, applying an etchant to the capping layer(s) 218 and the seed layer 132 with the photoresist layer in place, and removing the photoresist layer.

Figure 31:
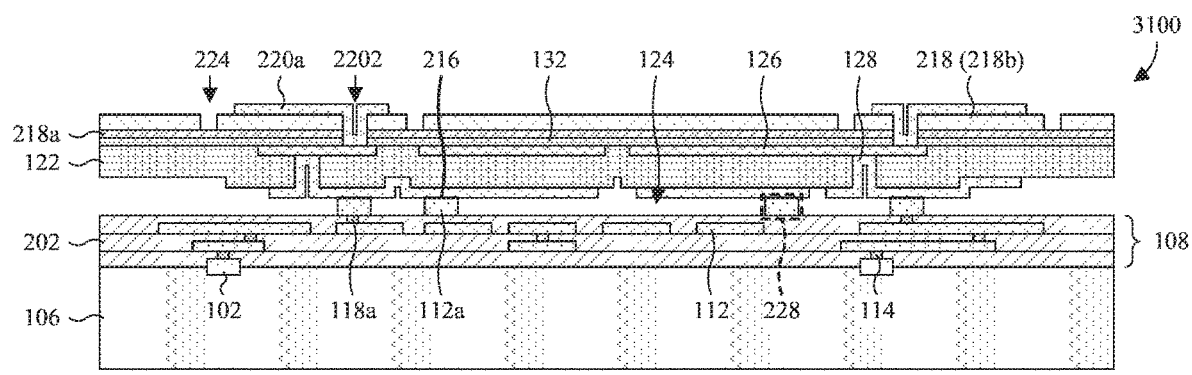

As illustrated by the cross-sectional view 3100 of FIG. 31, a third electrode layer 220a is formed over the capping layer(s) 218. Further, the third electrode layer 220a is formed lining the second through-via openings 2202, such that the third electrode layer 220a is electrically coupled to the first electrode layer 126. The third electrode layer 220a may, for example, be formed as described with regard to FIG. 22I.

Also illustrated by the cross-sectional view 3100 of FIG. 31, in some embodiments where the second capping layer 218b remains and is conductive, a third etch is performed into the second capping layer 218b. The third etch patterns the second capping layer 218b into individual segments, and forms isolation trenches 224 electrically isolating individual electrodes of the third electrode layer 220a, since the second capping layer 218b would otherwise short the electrodes together. The third etch may, for example, be performed as described with regard to FIG. 22I.

Advantageously, the methods of FIGS. 20, 21, 22A-22I, 23A-23K, and 24-31 form MEMS devices 104 and CMOS devices 102 integrated together by bonding processes and without the use of wire bonding, such that parasitic capacitance therebetween may be low. For example, the method of FIGS. 24-31 provides electrical coupling by the bonding process itself. As another example, the method of FIGS. 20, 21, 22A-22I, 23A-23K provides electrical coupling by through vias. Further, the methods may advantageously be performed at the wafer level for low packaging time and low packaging complexity. Further yet, the methods advantageously form the MEMS devices 104 on sacrificial substrates 2002 (see, e.g., FIG. 21) before the bonding processes to minimize post-bonding processes.

Figure 32:
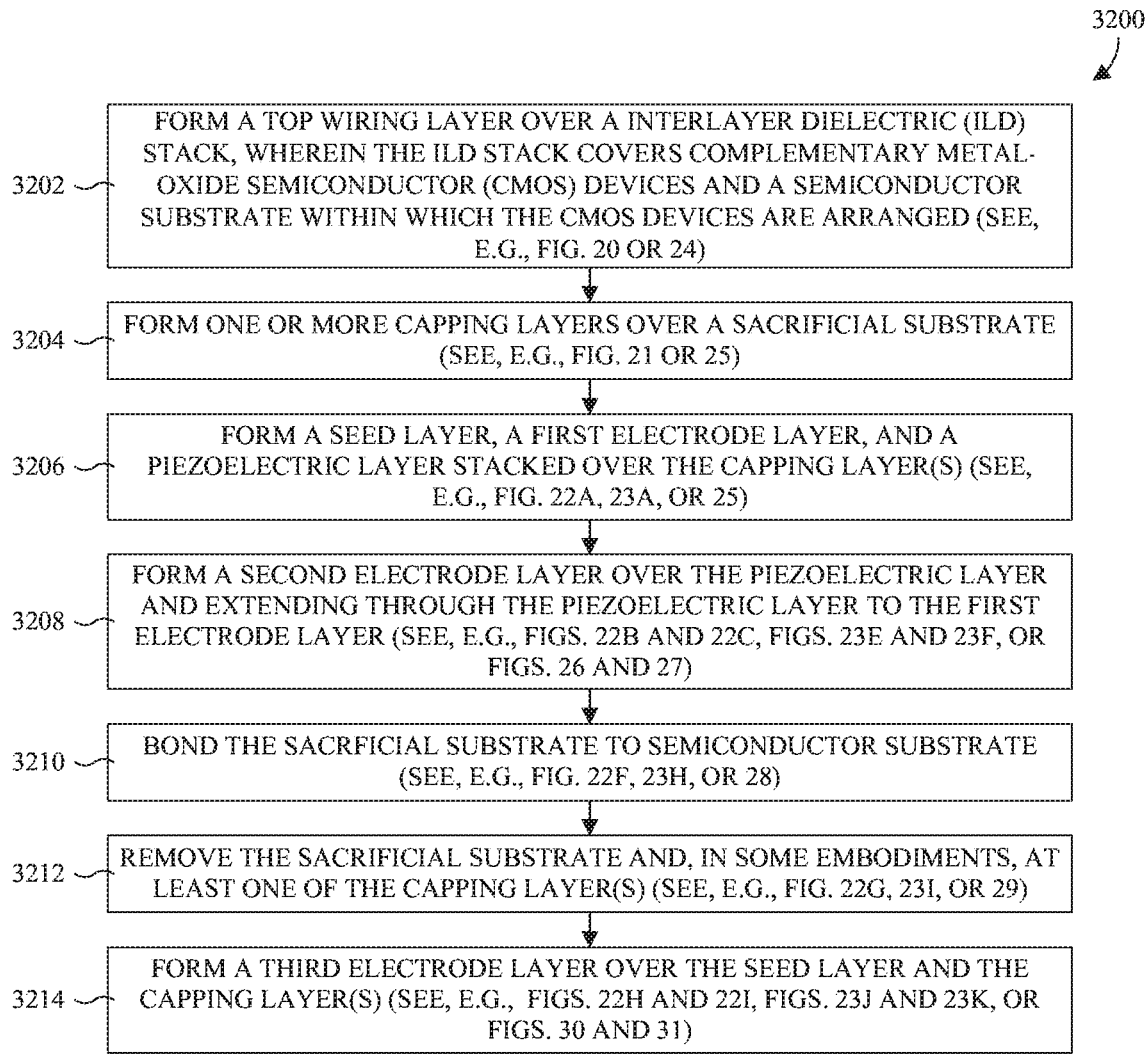
FIG. 32 illustrates a flowchart of some embodiments of the methods of FIGS. 20, 21, 22A-22I, 23A-23K, and 24-31.

With reference to FIG. 32, a flowchart 3200 of some embodiments of the methods of FIGS. 20, 21, 22A-22I, 23A-23K, and 24-31 is provided.

At 3202, a top wiring layer is formed over an ILD stack, where the ILD stack covers CMOS devices and a semiconductor substrate within which the CMOS devices are arranged. See, for example, FIG. 20 or 24.

At 3204, one or more capping layers is/are formed over a sacrificial substrate. See, for example, FIG. 21 or 25.

At 3206, a seed layer, a first electrode layer, and a piezoelectric layer are formed stacked over the capping layer(s). See, for example, FIG. 22A, 23A, or 25.

At 3208, a second electrode layer is formed over the piezoelectric layer and extending through the piezoelectric layer to the first electrode layer. See, for example, FIGS. 22B and 22C, FIGS. 23E and 23F, or FIGS. 26 and 27.

At 3210, the sacrificial substrate is bonded to the semiconductor substrate. See, for example, FIG. 22F, 23H, or 28.

At 3212, the sacrificial substrate and, in some embodiments, at least one of the capping layer(s) is/are removed. See, for example, FIG. 22G, 23I, or 29.

At 3214, a third electrode layer is formed over the seed layer and the capping layer(s). See, for example, FIGS. 22H and 22I, FIGS. 23J and 23K, or FIGS. 30 and 31.

While the methods described by the flowchart 3200 are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 33-35, 36A-36F, and 37A-37I, a series of cross-sectional views 3300-3500, 3600A-3600F, 3700A-3700I of some embodiments of a process for manufacturing the ICs of FIGS. 2I and 2J are provided.

Figure 33:
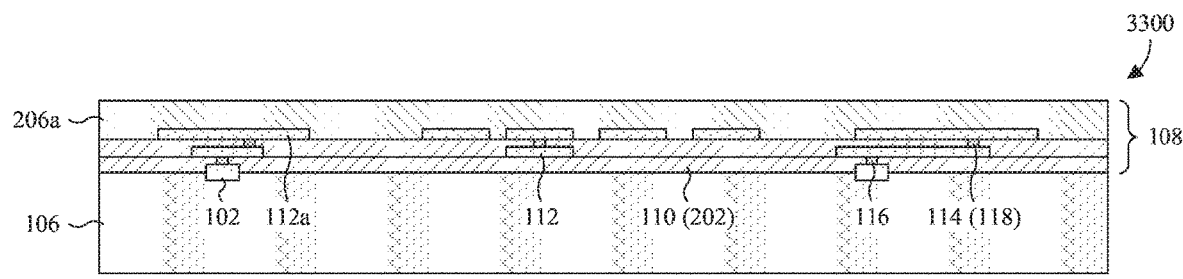
FIGS. 33-35, 36A-36F, and 37A-37I illustrate a series of cross-sectional views of some embodiments of methods for manufacturing the ICs of FIGS. 2I and 2J.

As illustrated by the cross-sectional view 3300 of FIG. 33, a CMOS IC is provided or otherwise formed. The CMOS IC comprises CMOS devices 102 arranged atop a semiconductor substrate 106, and a BEOL interconnect structure 108 covering the CMOS devices 102 and the semiconductor substrate 106. The BEOL interconnect structure 108 comprises a dielectric region 110, as well as a plurality of wiring layers 112 and a plurality of via layers 114 alternatingly stacked within the dielectric region 110. The dielectric region 110 comprises ILD layers 202 stacked upon one another and a first passivation layer 206a covering the ILD layers 202. The plurality of wiring layers 112 comprise a top wiring layer 112a electrically coupled to the CMOS devices 102 through underlying wiring layers and the via layers 114. The via layers 114 comprise a contact via layer 116 and one or more inter-wire via layers 118.

Figure 34:
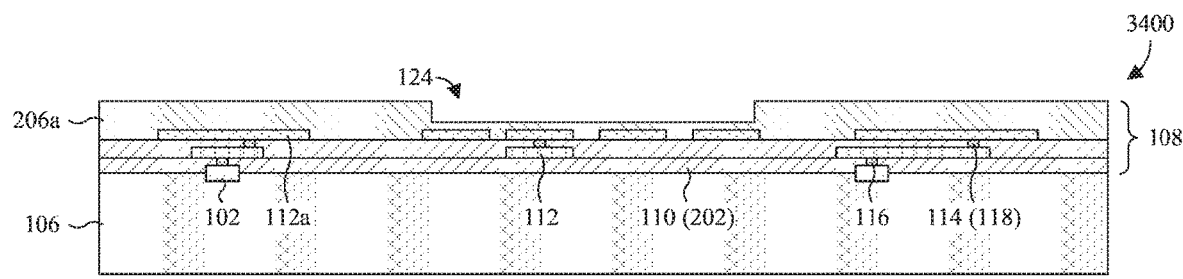

As illustrated by the cross-sectional view 3400 of FIG. 34, a first etch is performed into the first passivation layer 206a to form a cavity 124. In some embodiments, the process for performing the first etch comprises forming and patterning a photoresist layer over the first passivation layer 206a, applying an etchant to the first passivation layer 206a with the photoresist layer in place, removing the photoresist layer.

Figure 35:
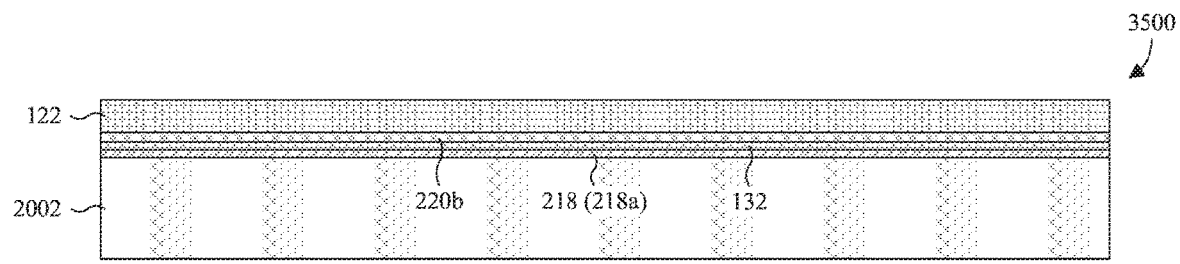

As illustrated by the cross-sectional view 3500 of FIG. 35, one or more capping layers 218 are formed stacked covering a sacrificial substrate 2002. The process for forming the capping layer(s) 218 may, for example, comprise sequentially depositing and/or growing the individual capping layers 218a by sputtering, thermal oxidation, vapor deposition, or a combination of the foregoing. In some embodiments, the capping layer(s) 218 are formed with only a first capping layer 218a. The first capping layer 218a may, for example, be formed of silicon dioxide or some other dielectric.

Also illustrated by the cross-sectional view 3500 of FIG. 35, a seed layer 132 is formed covering the capping layer(s) 218. The seed layer 132 may, for example, be formed of aluminum nitride, aluminum oxide, silicon carbide, or a dielectric material that is resistant to VHF or BOE. Further, the seed layer 132 may, for example, be formed by sputtering or vapor deposition.

Also illustrated by the cross-sectional view 3500 of FIG. 35, a third electrode layer 220b is formed covering the seed layer 132, and is further formed unpatterned. In some embodiments, the third electrode layer 220b is formed of molybdenum, aluminum, gold, or platinum. Further, in some embodiments, the process for forming the third electrode layer 220b comprises depositing or growing the third electrode layer 220b covering the seed layer 132 by, for example, sputtering or vapor deposition.

Also illustrated by the cross-sectional view 3500 of FIG. 35, a piezoelectric layer 122 is formed covering the third electrode layer 220b. In some embodiments, piezoelectric layer 122 is formed of aluminum nitride, zinc oxide, or lead zirconate titanate, and/or is formed of the same material as the seed layer 132. Further, in some embodiments, the piezoelectric layer 122 is formed by sputtering or vapor deposition.

With reference to FIGS. 36A-36F, a series of cross-sectional views 3600A-3600F of some embodiments of a method for manufacturing the IC of FIG. 2I is provided.

Figure 36A:
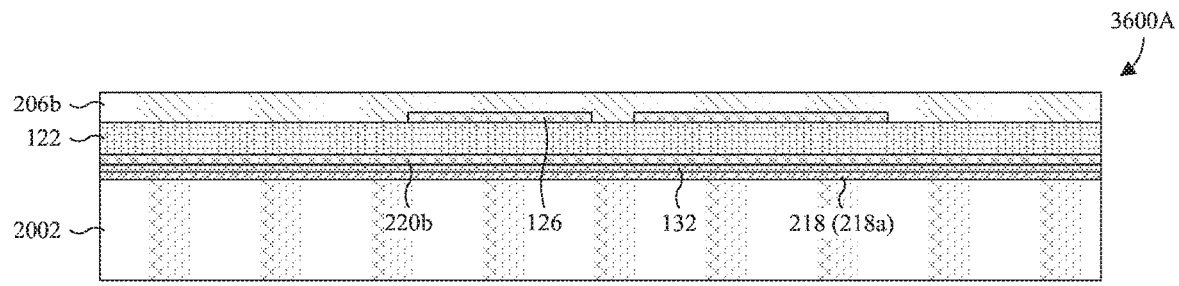

As illustrated by the cross-sectional view 3600A of FIG. 36A, a first electrode layer 126 is formed over the piezoelectric layer 122, and is further formed with a plurality of individual electrodes. In some embodiments, the first electrode layer 126 is formed of molybdenum, aluminum, gold, or platinum. Further, in some embodiments, the process for forming the first electrode layer 126 comprises depositing or growing the first electrode layer 126 covering the piezoelectric layer 122, and subsequently patterning the first electrode layer 126. The first electrode layer 126 may, for example, be deposited or grown by, for example, sputtering or vapor deposition, and the first electrode layer 126 may, for example, be patterned using photolithography.

Also illustrated by the cross-sectional view 3600A of FIG. 36A, a second passivation layer 206b is formed covering the piezoelectric layer 122 and the first electrode layer 126. Further, the second passivation layer 206b is formed with an upper or top surface that is planar. The second passivation layer 206b may be formed of, for example, silicon dioxide, a low κ dielectric, some other dielectric, or a combination of the foregoing.

In some embodiments, the process for forming the second passivation layer 206b comprises depositing or growing the second passivation layer 206b, and subsequently performing a planarization into the upper or top surface of the second passivation layer 206b. The second passivation layer 206b may, for example, be deposited or grown by, for example, vapor deposition, thermal oxidation, or sputtering. The planarization may, for example, be performed by a CMP.

Figure 36B:
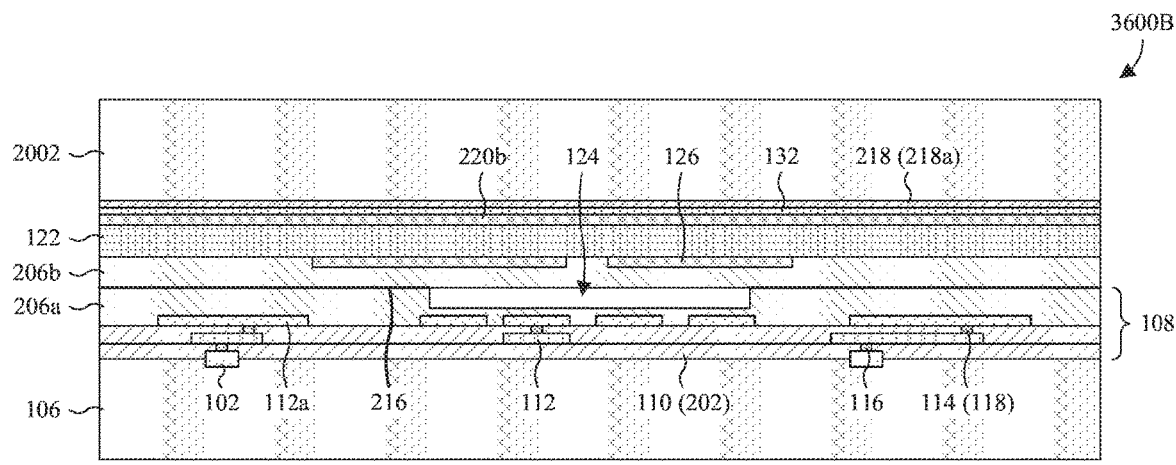

As illustrated by the cross-sectional view 3600B of FIG. 36B, the semiconductor structure of FIG. 36A is fusion bonded to the CMOS IC of FIG. 34 along a bond interface 216 between the first and second passivation layers 206a, 206b. In some embodiments, the fusion bonding is performed according to a hydrophilic fusion bonding process.

Figure 36C:
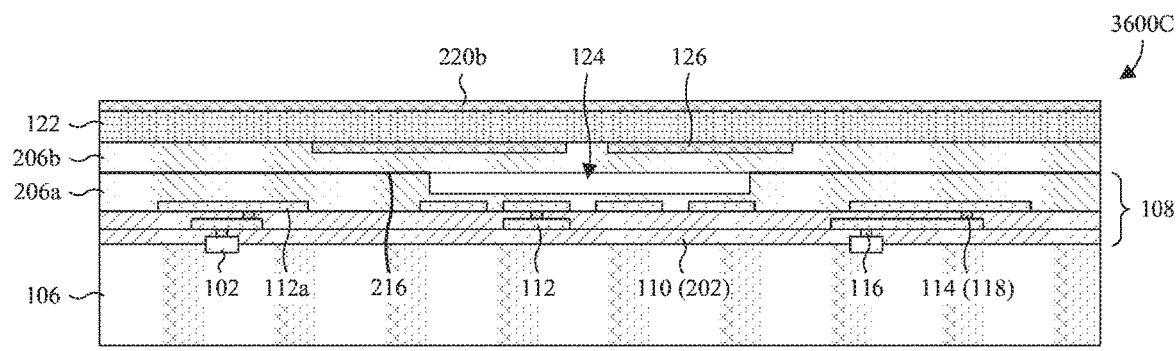

As illustrated by the cross-sectional view 3600C of FIG. 36C, the sacrificial substrate 2002 of FIG. 36B, the capping layer(s) 218 of FIG. 36B, and the seed layer 132 of FIG. 36B are removed, thereby exposing the third electrode layer 220b. In some embodiments, the process for removing the sacrificial substrate 2002, the capping layer(s) 218, and the seed layer 132 comprises a CMP and/or an etch back.

Figure 36D:
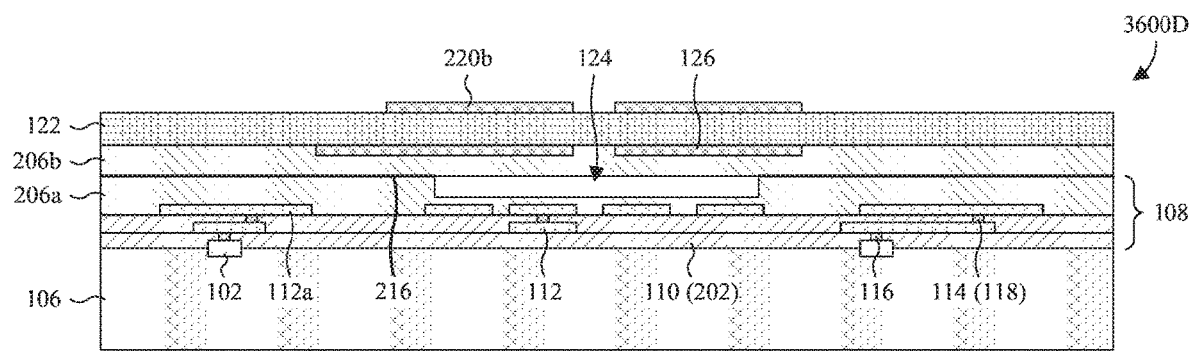

As illustrated by the cross-sectional view 3600D of FIG. 36D, a second etch is performed into the third electrode layer 220b to pattern the third electrode layer 220b and to form individual electrodes from the third electrode layer 220b. In some embodiments, the process for performing the second etch comprises forming and patterning a photoresist layer over the third electrode layer 220b, applying an etchant to the third electrode layer 220b with the photoresist layer in place, and removing the photoresist layer.

Figure 36E:
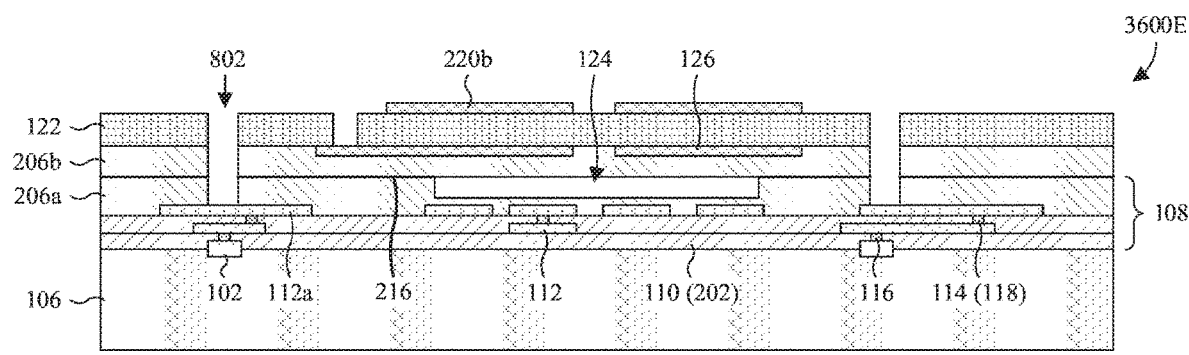

As illustrated by the cross-sectional view 3600E of FIG. 36E, a third etch is performed through the piezoelectric layer 122 to the top wiring layer 112a and the first electrode layer 126 to form a plurality of through-via openings 802 respectively exposing the top wiring layer 112a and the first electrode layer 126.

In some embodiments, the process for performing the third etch comprises forming and patterning a first photoresist layer over the piezoelectric layer 122 and the third electrode layer 220b. In such embodiments, a first etchant is applied to the piezoelectric layer 122 with the first photoresist layer in place to form a through-via opening exposing the first electrode layer 126, and the first photoresist layer is removed. Further, in some embodiments, the process comprises forming and patterning a second photoresist layer over the piezoelectric layer 122 and the third electrode layer 220b after removing the first photoresist layer. In such embodiments, a second etchant is applied to the piezoelectric layer 122 and the first and second passivation layers 206a, 206b with the second photoresist layer in place to form a through-via opening exposing the top wiring layer 112a, and the second photoresist layer is removed.

Figure 36F:
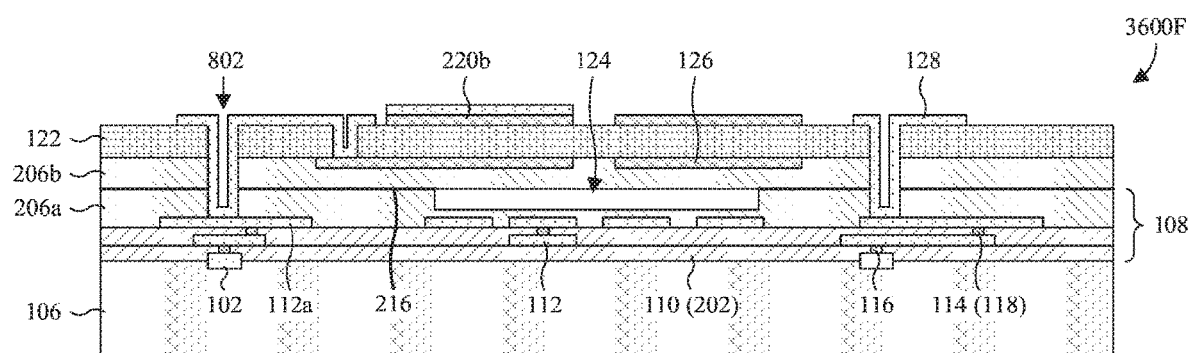

As illustrated by the cross-sectional view 3600F of FIG. 36F, a second electrode layer 128 is formed over the piezoelectric layer 122 and the third electrode layer 220b. Further, the second electrode layer 128 is formed lining the one or more through-via openings 802, such that the second electrode layer 128 is electrically coupled to the first electrode layer 126 and the top wiring layer 112a. In some embodiments, the process for forming the second electrode layer 128 comprises depositing or growing the second electrode layer 128, and subsequently patterning the second electrode layer 128. The second electrode layer 128 may be deposited or grown by, for example, sputtering or vapor deposition, and/or the patterning may be performed by, for example, photolithography.

With reference to FIGS. 37A-37I, a series of cross-sectional views 3700A-3700I of some embodiments of a method for manufacturing the IC of FIG. 2J is provided. The embodiments of FIGS. 37A-37I may be, for example, alternatives to the embodiments of FIGS. 36A-36F, and/or may, for example, proceed from FIG. 35

Figure 37A:
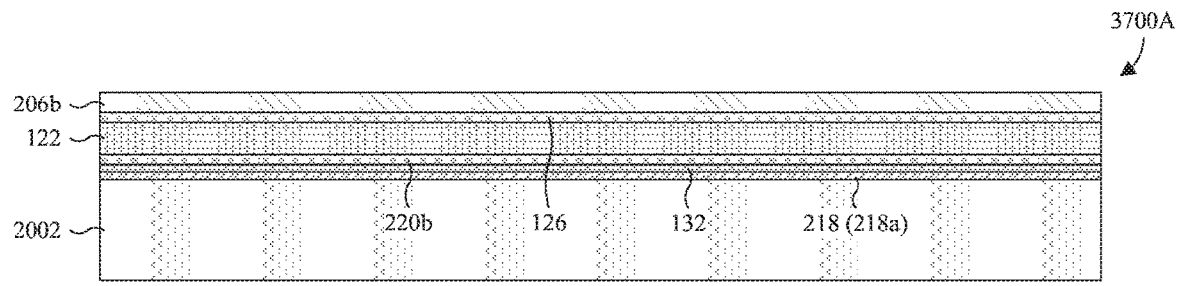

As illustrated by the cross-sectional view 3700A of FIG. 37A, a first electrode layer 126 is formed over the piezoelectric layer 122, and is formed unpatterned. The first electrode layer 126 may, for example, be formed as described with regard to FIG. 36A, except the first electrode layer 126 is not patterned.

Also illustrated by the cross-sectional view 3700A of FIG. 37A, a second passivation layer 206b is formed covering the first electrode layer 126. Further, the second passivation layer 206b is formed with an upper or top surface that is planar. The second passivation layer 206b may, for example, be formed as described with regard to FIG. 36A.

Figure 37B:
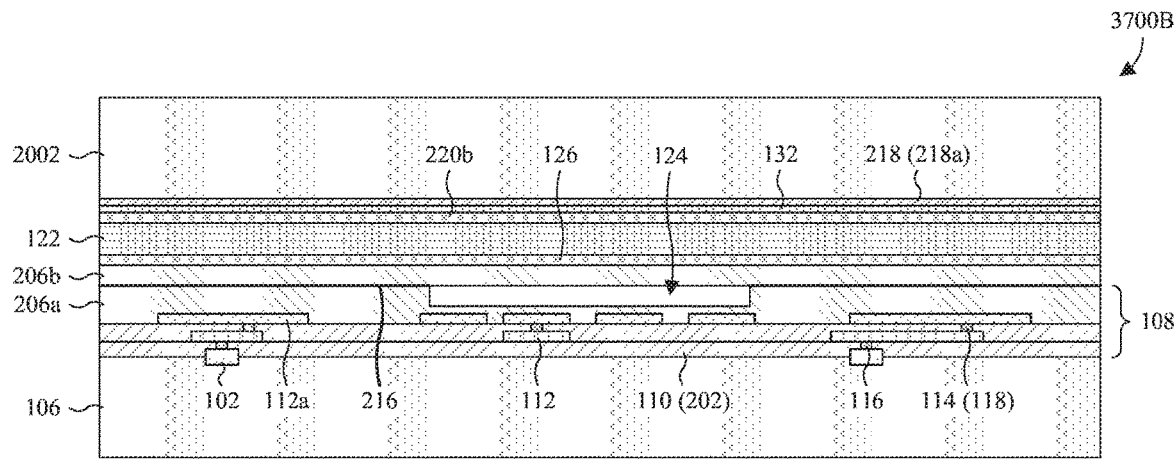

As illustrated by the cross-sectional view 3700B of FIG. 37B, the semiconductor structure of FIG. 37A is fusion bonded to the CMOS IC of FIG. 34 along a bond interface 216 between the first and second passivation layers 206a, 206b. The bonding may, for example, be performed as described with regard to FIG. 36B.

Figure 37C:
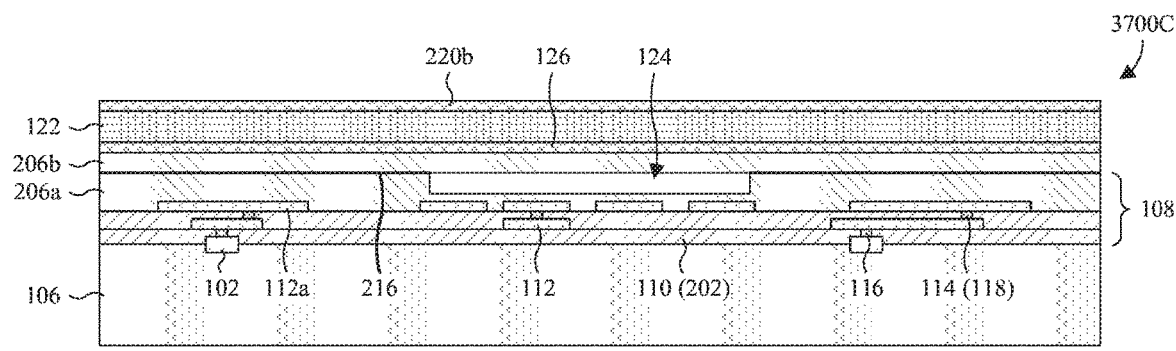

As illustrated by the cross-sectional view 3700C of FIG. 37C, the sacrificial substrate 2002 of FIG. 37B, the capping layer(s) 218 of FIG. 37B, and the seed layer 132 of FIG. 37B are removed, thereby exposing the third electrode layer 220b. The removal may, for example, be performed as described with regard to FIG. 36C.

Figure 37D:
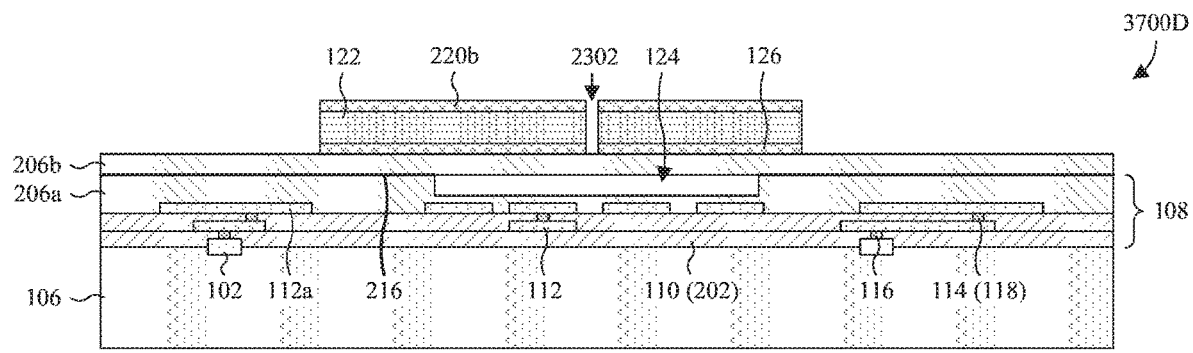

As illustrated by the cross-sectional view 3700D of FIG. 37D, a second etch is performed into the third electrode layer 220b, the first electrode layer 126, and the piezoelectric layer 122 to remove peripheral regions laterally surrounding a device region. Further, in some embodiments, the second etch forms a device opening 2302 in the device region. In some embodiments, the process for performing the second etch comprises forming and patterning a photoresist layer over the third electrode layer 220b, applying an etchant to the third electrode layer 220b, the first electrode layer 126, and the piezoelectric layer 122 with the photoresist layer in place, and removing the photoresist layer.

Figure 37E:
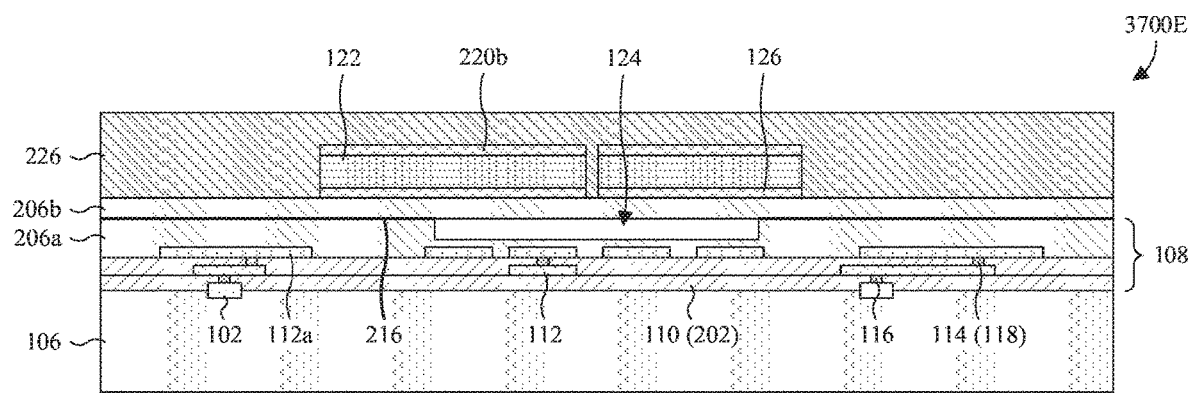

As illustrated by the cross-sectional view 3700E of FIG. 37E, an enclosing dielectric layer 226 is formed covering and laterally enclosing the third electrode layer 220b, the first electrode layer 126, and the piezoelectric layer 122. Further, the enclosing dielectric layer 226 is formed with an upper or top surface that is planar. The enclosing dielectric layer 226 may, for example, be formed of silicon dioxide, some other oxide, or some other dielectric.

In some embodiments, the process for forming the enclosing dielectric layer 226 comprises depositing or growing the enclosing dielectric layer 226, and subsequently performing a planarization into the upper or top surface of the enclosing dielectric layer 226. The enclosing dielectric layer 226 may, for example, be deposited or growth by, for example, sputtering, vapor deposition, or thermal oxidation. Further, the planarization may, for example, be performed by a CMP.

Figure 37F:
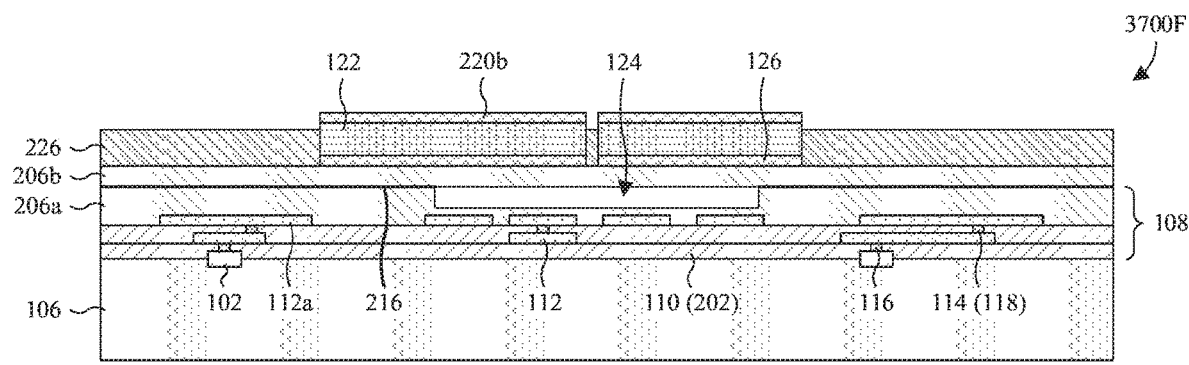

As illustrated by the cross-sectional view 3700F of FIG. 37F, a third etch is performed into the enclosing dielectric layer 226 to recess the upper or top surface of the enclosing dielectric layer 226 to a location spaced between an upper or top surface of the third electrode layer 220b and a lower or bottom surface of first electrode layer 126. In some embodiments, the third etch comprises applying an etchant to the enclosing dielectric layer 226 for a predetermined period of time. The etchant may, for example, be selective or preferential of the enclosing dielectric layer 226 relative to the third electrode layer 220b, the first electrode layer 126, and the piezoelectric layer 122.

Figure 37G:
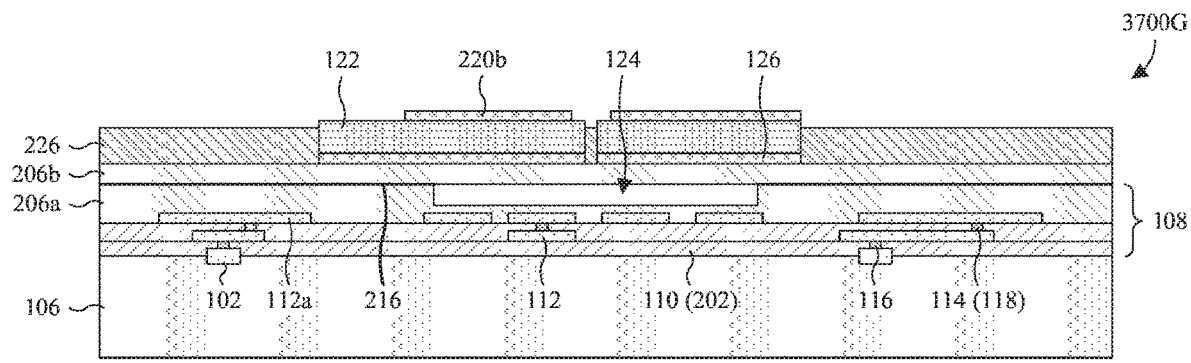

As illustrated by the cross-sectional view 3700G of FIG. 37G, a fourth etch is performed into the third electrode layer 220b to pattern the third electrode layer 220b and to form individual electrodes from the third electrode layer 220b. The fourth etch may, for example, be performed as described with regard to FIG. 36D.

Figure 37H:
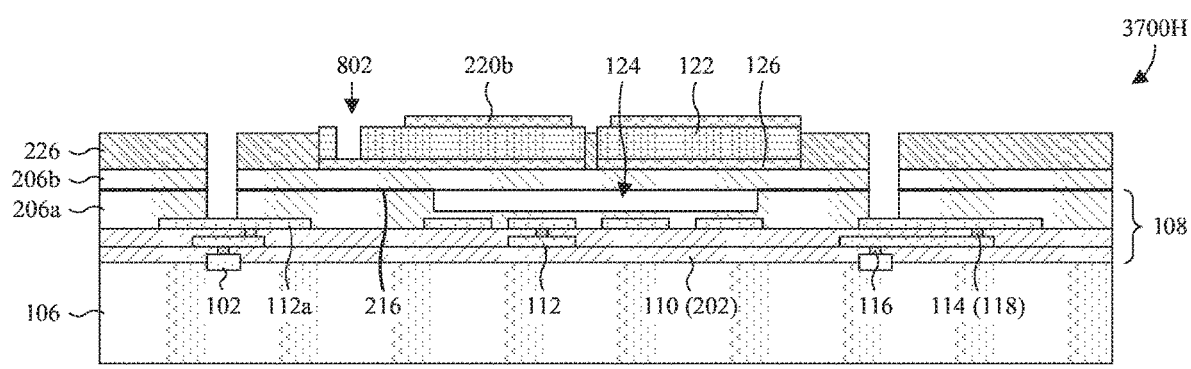

As illustrated by the cross-sectional view 3700H of FIG. 37H, a fifth etch is performed through the piezoelectric layer 122 to the top wiring layer 112a and the first electrode layer 126 to form a plurality of through-via openings 802 respectively exposing the top wiring layer 112a and the first electrode layer 126. The fifth etch may, for example, be performed as described with regard to FIG. 36E.

Figure 37I:
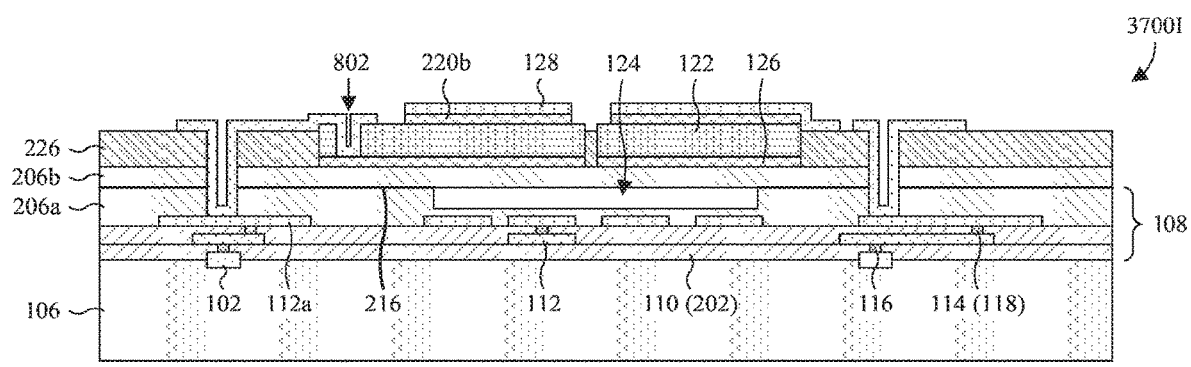

As illustrated by the cross-sectional view 3700I of FIG. 37I, a second electrode layer 128 is formed over the piezoelectric layer 122 and the third electrode layer 220b. Further, the second electrode layer 128 is formed lining the one or more through-via openings 802, such that the second electrode layer 128 is electrically coupled to the first electrode layer 126 and the top wiring layer 112a. The second electrode layer 128 may, for example, be formed as described with regard to FIG. 36F.

Advantageously, the methods of FIGS. 33-35, 36A-36F, and 37A-37I form MEMS devices 104 and CMOS devices 102 integrated together by bonding processes and without the use of wire bonding, such that parasitic capacitance therebetween may be low. Further, the methods may advantageously be performed at the wafer level for low packaging time and low packaging complexity. Further yet, the methods advantageously form the MEMS devices 104 on sacrificial substrates 2002 before the bonding processes to minimize post-bonding processes. Further yet, the methods pattern the third electrode layer 220b after forming the piezoelectric layer 122, such that the piezoelectric layer 122 may be high quality. For example, the piezoelectric layer 122 may have a highly uniform crystalline orientation. As a result of the improved quality of the piezoelectric layer 122, the MEMS device 104 may, for example, have high performance and/or sensitivity.

Figure 38:
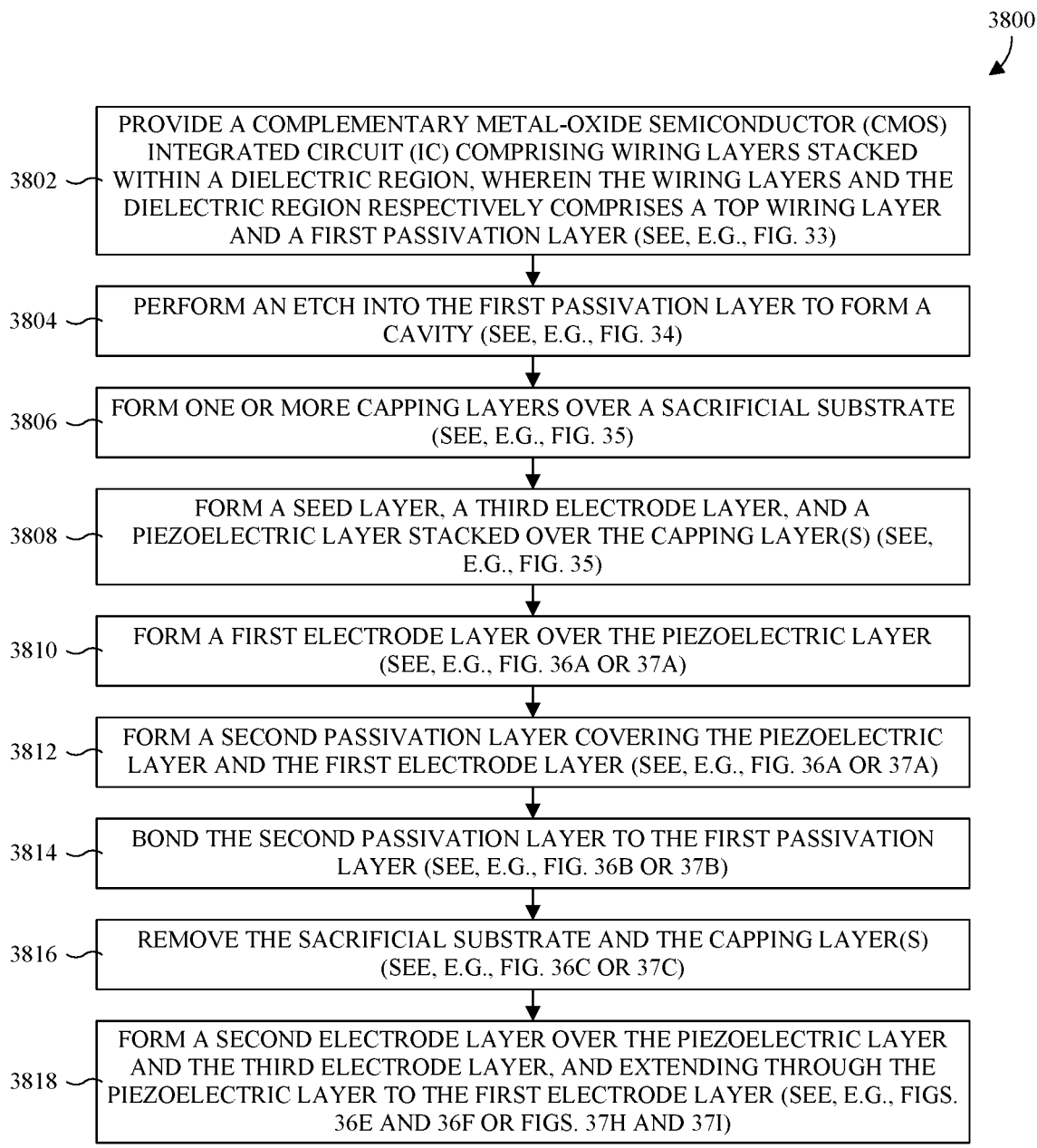
FIG. 38 illustrates a flowchart of some embodiments of the methods of FIGS. 33-35, 36A-36F, and 37A-37I.

With reference to FIG. 38, a flowchart 3800 of some embodiments of the methods of FIGS. 33-35, 36A-36F, and 37A-37I is provided.

At 3802, a CMOS IC comprising wiring layers stacked within a dielectric region is provided, where the wiring layers and the dielectric region respectively comprises a top wiring layer and a first passivation layer covering the top wiring layer. See, for example, FIG. 33.

At 3804, an etch is performed into the first passivation layer to form a cavity. See, for example, FIG. 34.

At 3806, one or more capping layers is/are formed over a sacrificial substrate. See, for example, FIG. 35.

At 3808, a seed layer, a third electrode layer, and a piezoelectric layer are formed stacked over the capping layer(s). See, for example, FIG. 35.

At 3810, a first electrode layer is formed over the piezoelectric layer. See, for example, FIG. 36A or 37A.

At 3812, a second passivation layer is formed covering the piezoelectric layer and the first electrode layer. See, for example, FIG. 36A or 37A.

At 3814, the second passivation layer is bonded to the first passivation layer. See, for example, FIG. 36B or 37B.

At 3816, the sacrificial substrate and the capping layer(s) are removed. See, for example, FIG. 36C or 37C.

At 3818, a second electrode layer is formed over the piezoelectric layer and the third electrode layer, and extending through the piezoelectric layer to the first electrode layer. See, for example, FIGS. 36E and 36F or FIGS. 37H and 37I.

While the methods described by the flowchart 3800 are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application provide an IC comprising a semiconductor substrate, a BEOL interconnect structure, a piezoelectric layer, a first electrode layer, a second electrode layer, and a cavity. The BEOL interconnect structure is over the semiconductor substrate. The piezoelectric layer is over the BEOL interconnect structure and comprises a MEMS device. A first electrode layer and a second electrode layer are over the BEOL interconnect structure. The piezoelectric layer is arranged between the first and second electrode layers, and the second electrode layer comprises a via extending through the piezoelectric layer to the first electrode layer. The cavity is between the semiconductor substrate and the piezoelectric layer. The MEMS device is configured to move within the cavity.

Further, other embodiments of the present application provide a method for manufacturing an IC. A BEOL interconnect structure is formed covering a semiconductor substrate, where the BEOL interconnect structure comprises a dielectric stack. A first etch is performed into the dielectric stack to form a trench laterally surrounding a sacrificial dielectric region. A lateral etch stop layer is formed lining the trench. A piezoelectric layer is formed covering the dielectric stack and the lateral etch stop layer. A second etch is performed into the sacrificial dielectric region to remove the sacrificial dielectric region and to form a cavity in place of the sacrificial dielectric region.

Further yet, other embodiments of the present application provide a method for manufacturing an IC. A top wiring layer is formed over ILD layers that are stacked over a semiconductor substrate. The top wiring layer is formed electrically coupled to electronic devices on the semiconductor substrate through wiring in the ILD layers. A piezoelectric layer is formed over a sacrificial substrate. A first electrode layer is formed over the sacrificial substrate. The sacrificial substrate is bonded to the semiconductor substrate, such that the sacrificial substrate overlies the top wiring layer and the piezoelectric layer. The sacrificial substrate is removed. A second electrode layer is formed on the piezoelectric layer and comprises a via extending through the piezoelectric layer to the first electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
   a semiconductor substrate;
   a back-end-of-line (BEOL) interconnect structure over the semiconductor substrate;
   a piezoelectric layer over the BEOL interconnect structure and comprising a microelectromechanical systems (MEMS) device;
   a first electrode layer and a second electrode layer over the BEOL interconnect structure, wherein the piezoelectric layer is arranged between the first and second electrode layers, and wherein the second electrode layer comprises a via extending through the piezoelectric layer to the first electrode layer; and
   a cavity between the semiconductor substrate and the piezoelectric layer, between the semiconductor substrate and the first electrode layer, and between the semiconductor substrate and the second electrode layer, wherein the MEMS device is configured to move within the cavity; and
   an enclosing dielectric layer laterally enclosing the piezoelectric layer, wherein the second electrode layer comprises an additional via extending through the enclosing dielectric layer to a top wiring layer of the BEOL interconnect structure, wherein the additional via is laterally spaced from the piezoelectric layer, and wherein the enclosing dielectric layer laterally contacts first sidewalls of the piezoelectric layer and has a bottom surface that is even with a bottom surface of the first electrode layer.

2. The IC according to claim 1, wherein the first electrode layer is under the piezoelectric layer, and wherein the second electrode layer is over the piezoelectric layer.

3. The IC according to claim 1, further comprising:
   an electronic device over and within the semiconductor substrate, wherein the electronic device is electrically coupled to the MEMS device through the BEOL interconnect structure and the first and second electrode layers.

4. The IC according to claim 1, wherein the via extends continuously through the piezoelectric layer to contact with the first electrode layer, and wherein the via laterally contacts second sidewalls of the piezoelectric layer.

5. The IC according to claim 1, wherein the BEOL interconnect structure comprises:
   a dielectric structure; and
   a plurality of wiring layers and a plurality of via layers, wherein the plurality of wiring layers includes the top wiring layer, and wherein the wiring layers and the via layers are alternatingly stacked in the dielectric structure.

6. An integrated circuit (IC) comprising:
   a substrate;
   an interconnect structure over the substrate, wherein the interconnect structure comprises a first level of wires and a second level of wires, and further comprises a vertical etch stop layer between the first and second levels of wires;
   a piezoelectric structure over the interconnect structure and comprising a microelectromechanical systems (MEMS) device;
   a cavity between the substrate and the piezoelectric structure, wherein the MEMS device is configured to move within the cavity; and
   a lateral etch stop layer comprising a pair of etch stop segments when viewed in cross section, wherein the etch stop segments are in the cavity and respectively on opposite sides of the cavity, and wherein the etch stop segments extend downward from the piezoelectric structure to the vertical etch stop layer.

7. The IC according to claim 6, wherein the etch stop segments each has a U-shaped profile.

8. The IC according to claim 6, further comprising:
   a dielectric filler layer comprising a pair of dielectric filler segments when viewed in cross section, wherein the dielectric filler segments are respectively on the opposite sides of the cavity and extend downward from the piezoelectric structure, and wherein the etch stop segments respectively wrap around bottoms of the dielectric filler segments.

9. The IC according to claim 6, wherein the lateral etch stop layer comprises a same material as the piezoelectric structure.

10. The IC according to claim 6, further comprising:
    a first electrode layer buried completely within the piezoelectric structure; and
    a second electrode layer overlying the piezoelectric structure and having a downward protrusion protruding into the piezoelectric structure to the first electrode layer.

11. The IC according to claim 10, further comprising:
    an electronic device over and within the substrate, wherein the electronic device is electrically coupled to the MEMS device through the interconnect structure and the first and second electrode layers.

12. The IC according to claim 10, wherein the downward protrusion laterally contacts sidewalls of the piezoelectric structure.

13. The IC according to claim 6, wherein the interconnect structure further comprises a level vias extending through the vertical etch stop layer from the first level of wires to the second level of wires.

14. An integrated circuit (IC) comprising:
    a substrate;
    an interconnect structure over the substrate;

a piezoelectric structure over the interconnect structure and comprising a microelectromechanical systems (MEMS) device;

a cavity between the interconnect structure and the piezoelectric structure, wherein the MEMS device is configured to move within the cavity;

a first electrode layer completely surrounded by the piezoelectric structure; and a second electrode layer on a bottom surface of the piezoelectric structure and in the cavity, wherein the second electrode layer protrudes into the piezoelectric structure to the first electrode layer.

15. The IC according to claim 14, wherein the piezoelectric structure has a pair of piezoelectric sidewalls, wherein the piezoelectric sidewalls are respectively on opposite sides of the piezoelectric structure, and wherein the second electrode layer wraps around bottom corners of the piezoelectric structure from the bottom surface of the piezoelectric structure to the piezoelectric sidewalls.

16. The IC according to claim 14, wherein the interconnect structure comprises:
a dielectric structure;
a plurality of lower level wires and a plurality of vias, wherein the lower level wires and the vias are alternatingly stacked in the dielectric structure; and
a plurality of top level wires on the dielectric structure and electrically coupled to the lower level wires by the vias, wherein the top level wires define sidewalls of the cavity and extend to the second electrode layer.

17. The IC according to claim 14, further comprising:
a polysilicon layer overlying the piezoelectric structure; and
a third electrode layer overlying the polysilicon layer, wherein the third electrode layer extends continuously to a wire in the interconnect structure.

18. The IC according to claim 14, further comprising:
an electronic device over and within the substrate, wherein the electronic device is electrically coupled to the MEMS device through the interconnect structure and the first and second electrode layers.

19. The IC according to claim 14, wherein the second electrode layer protrudes into the piezoelectric structure to the first electrode layer at a via, and wherein the via laterally contacts sidewalls of the piezoelectric structure.

20. The IC according to claim 14, wherein the interconnect structure comprises:
a dielectric structure; and
a plurality of wires and a plurality of vias, wherein the wires and the vias are alternatingly stacked in the dielectric structure.

* * * * *